US011956999B2

(12) United States Patent
Choi

(10) Patent No.: US 11,956,999 B2
(45) Date of Patent: Apr. 9, 2024

(54) ORGANIC LIGHT EMITTING DISPLAY DEVICE

(71) Applicant: Samsung Display Co., Ltd., Yongin-si (KR)

(72) Inventor: Jong Hyun Choi, Seoul (KR)

(73) Assignee: Samsung Display Co., Ltd., Yongin-si (KR)

(*) Notice: Subject to any disclaimer, the term of this patent is extended or adjusted under 35 U.S.C. 154(b) by 519 days.

(21) Appl. No.: 16/736,690

(22) Filed: Jan. 7, 2020

(65) Prior Publication Data

US 2020/0258960 A1 Aug. 13, 2020

(30) Foreign Application Priority Data

Feb. 13, 2019 (KR) .......................... 10-2019-0016607

(51) Int. Cl.
*H10K 59/122* (2023.01)
*H10K 50/844* (2023.01)
*H10K 59/121* (2023.01)

(52) U.S. Cl.
CPC ....... *H10K 59/122* (2023.02); *H10K 50/8445* (2023.02); *H10K 59/121* (2023.02)

(58) Field of Classification Search
CPC ............... H01L 27/3246; H01L 27/326; H01L 51/5256; H10K 59/00; H10K 71/00; H10K 50/8423; H10K 50/8426; H10K 50/8445; H10K 59/8721; H10K 59/8722; H10K 59/122; H10K 59/121; H10K 59/13; H10K 59/8731; H10K 59/70
See application file for complete search history.

(56) References Cited

U.S. PATENT DOCUMENTS

2017/0148856 A1  5/2017  Choi et al.
2017/0288004 A1  10/2017  Kim et al.
2020/0127233 A1* 4/2020  Sung ................. H01L 21/76205

FOREIGN PATENT DOCUMENTS

JP          5782074 B2      9/2015
KR   10-2015-0071642 A     6/2015
KR   10-2017-0059864 A     5/2017

OTHER PUBLICATIONS

Extended European Search Report for corresponding European Patent Application No. 20156245.1, dated Jun. 19, 2020, 7 pages.

* cited by examiner

*Primary Examiner* — Latanya N Crawford Eason
(74) *Attorney, Agent, or Firm* — Lewis Roca Rothgerber Christie LLP

(57) ABSTRACT

An organic light emitting display device includes a substrate, a light emitting structure, an undercut structure, and a functional module. The substrate includes an opening region, a peripheral region surrounding the opening region, and a display region surrounding the peripheral region. The substrate has a groove in the peripheral region and an opening in the opening region. The light emitting structure is in the display region on the substrate. The undercut structure is inside the groove in the substrate. The undercut structure includes a sacrificial metal pattern having a first width and at least one insulating layer pattern having a second width greater than the first width. The functional module is in the opening of the substrate.

24 Claims, 25 Drawing Sheets

ORGANIC LIGHT EMITTING DISPLAY DEVICE

CROSS-REFERENCE TO RELATED APPLICATION

This application claims priority to and the benefit of Korean Patent Application No. 10-2019-0016607 filed on Feb. 13, 2019 in the Korean Intellectual Property Office (KIPO), the entire disclosure of which is incorporated herein by reference.

BACKGROUND

1. Field

Example embodiments relate generally to an organic light emitting display device and to an organic light emitting display device including functional modules that are in a part of a display region.

2. Description of the Related Art

A flat panel display device is used as a display device to replace a cathode ray tube display device because the flat panel display device is light weight and has thin features or the like. A liquid crystal display device and an organic light emitting display device are typical examples of the flat panel display device.

The organic light emitting display device may include a display region configured to display an image and a non-display region surrounding the display region configured not to display the image. For example, a plurality of light emitting structures may be disposed in the display region, and a gate driver, a data driver, a plurality of wires, a functional module (such as a camera module and a motion sensor) may be disposed in the non-display region. Recently, an organic light emitting display device has been developed in which an opening is formed in a part of the display region and the functional module is disposed in the opening. However, moisture, humidity and the like can permeate through the opening into the light emitting structure, which is disposed in the display region adjacent to the functional module, and thus a defect may generate in the organic light emitting display device.

SUMMARY

Some example embodiments provide an organic light emitting display ("OLED") device including functional modules that are in a part of a display region.

According to some example embodiments, an OLED device includes a substrate, a light emitting structure, an undercut structure, and a functional module. The substrate includes an opening region, a peripheral region surrounding the opening region, and a display region surrounding the peripheral region. The substrate has a groove in the peripheral region and an opening in the opening region. The light emitting structure is in the display region on the substrate. The undercut structure is inside the groove in the substrate, and includes a sacrificial metal pattern having a first width and at least one insulating layer pattern having a second width greater than the first width. The functional module is in the opening of the substrate.

In example embodiments, the undercut structure may be spaced apart from an inner wall of the groove.

In example embodiments, the groove may have a hollow circular shape surrounding the opening of the substrate in a plan view.

In example embodiments, the undercut structure may have a hollow circular shape surrounding the opening inside the groove in a plan view.

In example embodiments, the substrate may include a first organic film layer, a first barrier layer, a second organic film layer, and a second barrier layer. The first barrier layer may be on the first organic film layer. The second organic film layer may be on the first barrier layer, and may have a first opening in the peripheral region. The second barrier layer may be on the second organic film layer, and may have a second opening overlapping the first opening.

In example embodiments, the sacrificial metal pattern may be on the first barrier layer.

In example embodiments, the insulating layer pattern may include a first insulating layer pattern on the sacrificial metal pattern and a second insulating layer pattern on the first insulating layer pattern.

In example embodiments, the first insulating layer pattern may be located at a same layer as the second organic film layer, and the second insulating layer pattern may be located at a same layer as the second barrier layer.

In example embodiments, the first opening and the second opening may define the groove in the substrate.

In example embodiments, the OLED device may further include a semiconductor element between the substrate and the light emitting structure.

In example embodiments, the semiconductor element may include an active layer, a gate insulating layer, a gate electrode, an insulating interlayer, and source and drain electrodes. The active layer may be in the display region on the substrate. The gate insulating layer may cover the active layer in the display region on the substrate, and may have a third opening exposing the groove in the peripheral region. The gate electrode may be in the display region on the gate insulating layer. The insulating interlayer may cover the gate electrode in the display region on the gate insulating layer, and may have a fourth opening overlapping the third opening in the peripheral region. The source and drain electrodes may be in the display region on the insulating interlayer.

In example embodiments, the insulating layer pattern may include a third insulating layer pattern and a fourth insulating layer pattern. The third insulating layer pattern may be on the sacrificial metal pattern, and may be located inside the third opening. The fourth insulating layer pattern may be on the third insulating layer pattern, and may be located inside the fourth opening.

In example embodiments, the third insulating layer pattern may be located at a same layer as the gate insulating layer, and may be located at a same layer as the insulating interlayer.

In example embodiments, the light emitting structure may include a lower electrode, a light emitting layer on the lower electrode, and an upper electrode on the light emitting layer.

In example embodiments, the light emitting layer may extend in a direction from the display region to the peripheral region on the substrate, and may be short-circuited by the undercut structure at a portion where the groove is located.

In example embodiments, the upper electrode may extend in a direction from the display region to the peripheral region on the light emitting layer, and may be short-circuited by the undercut structure at a portion where the groove is located.

In example embodiments, the light emitting layer and the upper electrode may be at least partially inside of the groove.

In example embodiments, the light emitting layer and the upper electrode may be on at least a part of the undercut structure.

In example embodiments, the light emitting layer and the upper electrode might not be in direct contact with the sacrificial metal pattern.

In example embodiments, the OLED device may further include a thin film encapsulation structure disposed on the light emitting structure. The thin film encapsulation structure may include a first thin film encapsulation layer, a second thin film encapsulation layer, and a third thin film encapsulation layer. The first thin film encapsulation layer may be on the upper electrode, and may include a flexible inorganic material. The second thin film encapsulation layer may be on the first thin film encapsulation layer, and may include a flexible organic material. The third thin film encapsulation layer may be on the second thin film encapsulation layer, and may include the flexible inorganic material.

In example embodiments, each of the first and third thin film encapsulation layers may extend in a direction from the display region to the peripheral region on the upper electrode, and may be continuous at the portion where the groove is located.

In example embodiments, the functional module may be in contact with a side surface of the substrate, a side surface of the light emitting layer, a side surface of the upper electrode, a side surface of the first thin film encapsulation layer, and a side surface of the third thin film encapsulation layer at a boundary between the peripheral region and the opening region.

In example embodiments, both side portions of the sacrificial metal pattern may be in direct contact with the first thin film encapsulation layer.

In example embodiments, the groove of the substrate may include a first groove located in the peripheral region and a second groove located between the first groove and the functional module. The first groove may surround the second groove.

In example embodiments, the undercut structure may include a first undercut structure inside the first groove and a second undercut structure inside the second groove.

As the OLED device according to example embodiments includes the undercut structure inside the groove so that the OLED device can prevent or mitigate against moisture, humidity and the like from permeating or penetrating into the semiconductor element and the light emitting structure from the peripheral region to the display region.

BRIEF DESCRIPTION OF THE DRAWINGS

Example embodiments can be understood in more detail from the following description taken in conjunction with the accompanying drawings, in which.

DETAILED DESCRIPTION

Figure 1:
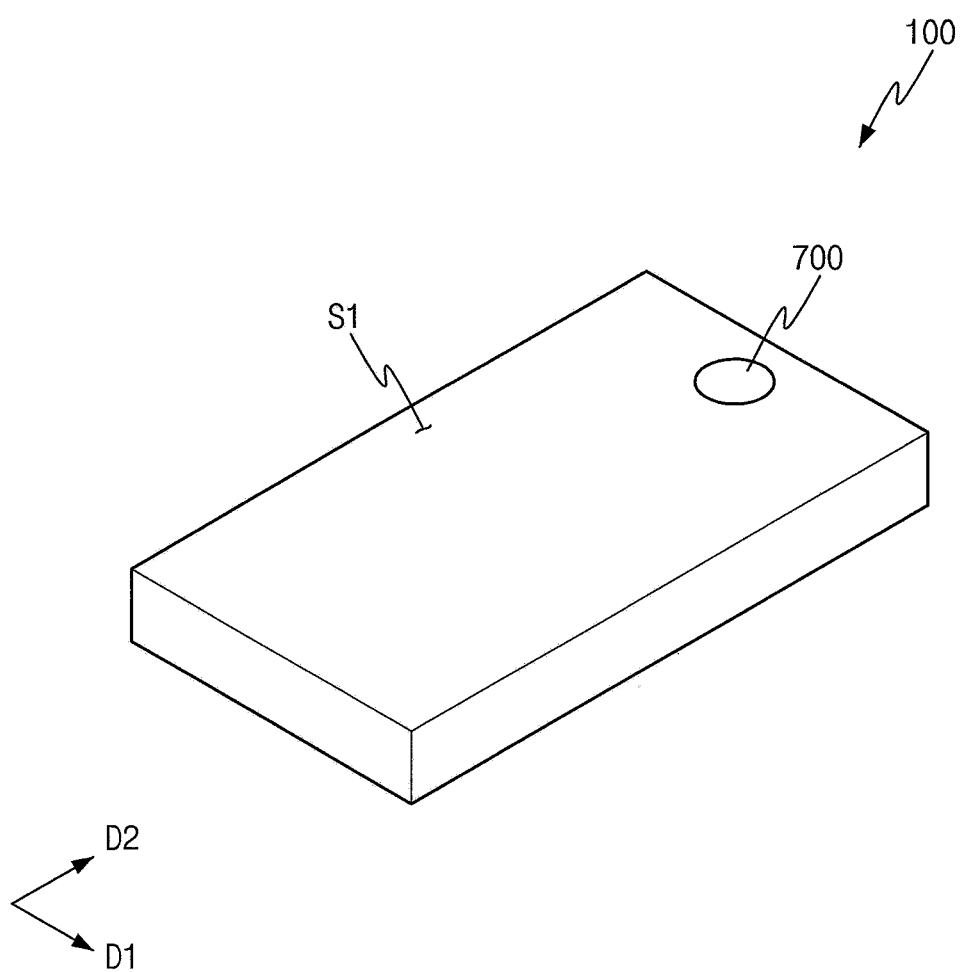
FIG. 1 is a perspective view showing an organic light emitting display ("OLED") device according to exemplary embodiments of the present invention.

Hereinafter, organic light emitting display ("OLED") devices and methods of manufacturing the same according to exemplary embodiments of the present invention will be described in detail with reference to the accompanying drawings. In the accompanying drawings, same or similar reference numerals refer to the same or similar elements.

Figure 2:
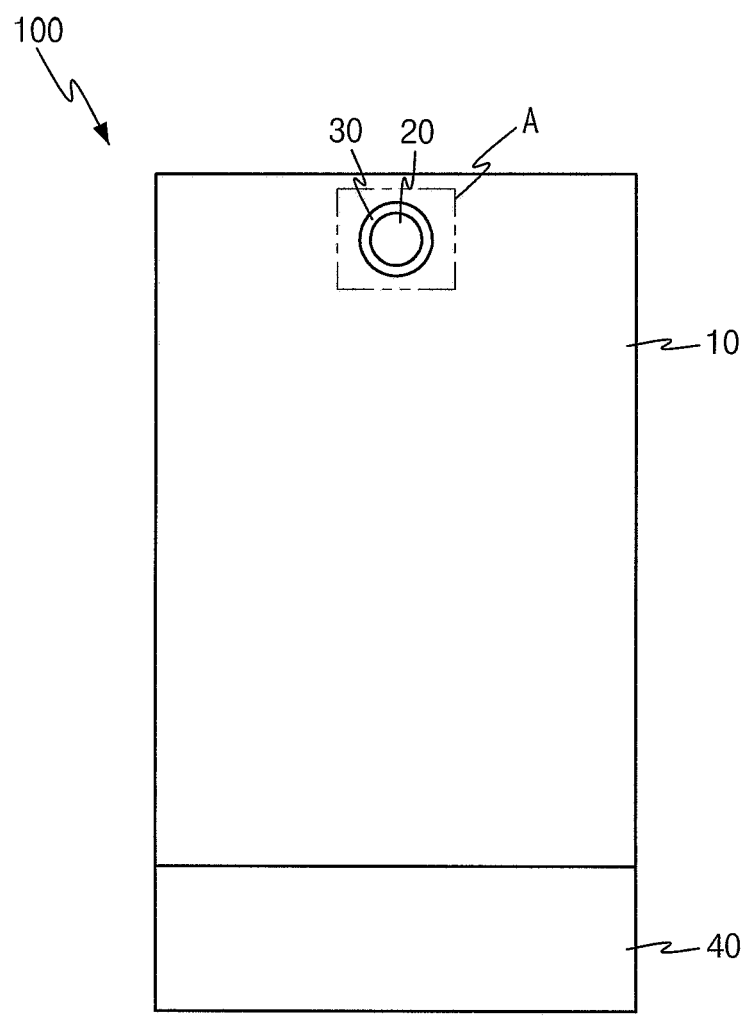
FIG. 2 is a plan view showing the OLED device of FIG. 1.
Figure 3:
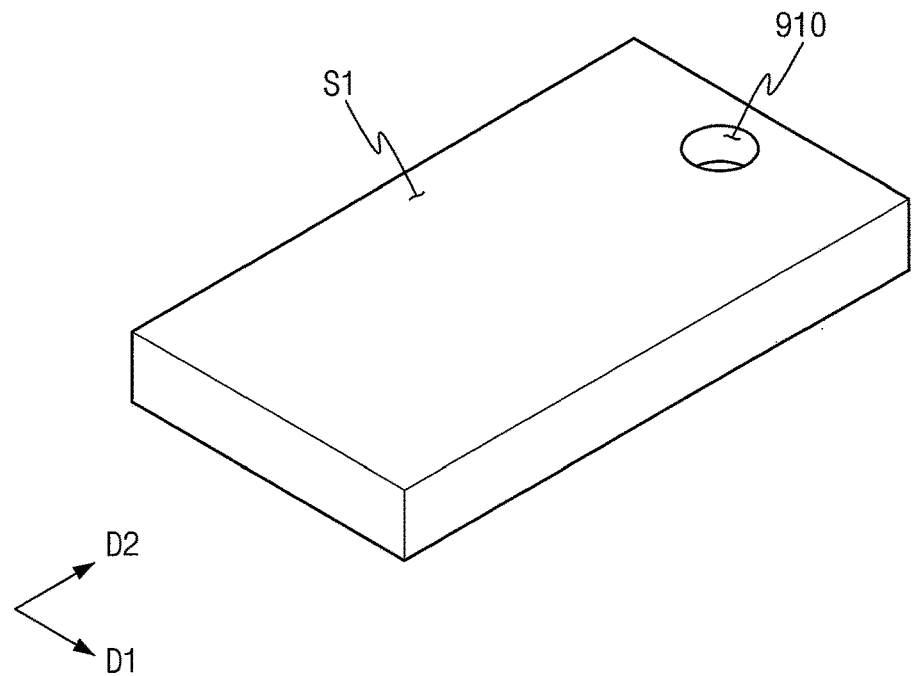
FIGS. 3 and 4 are perspective views describing an opening formed in the OLED device of FIG. 1.
Figure 4:
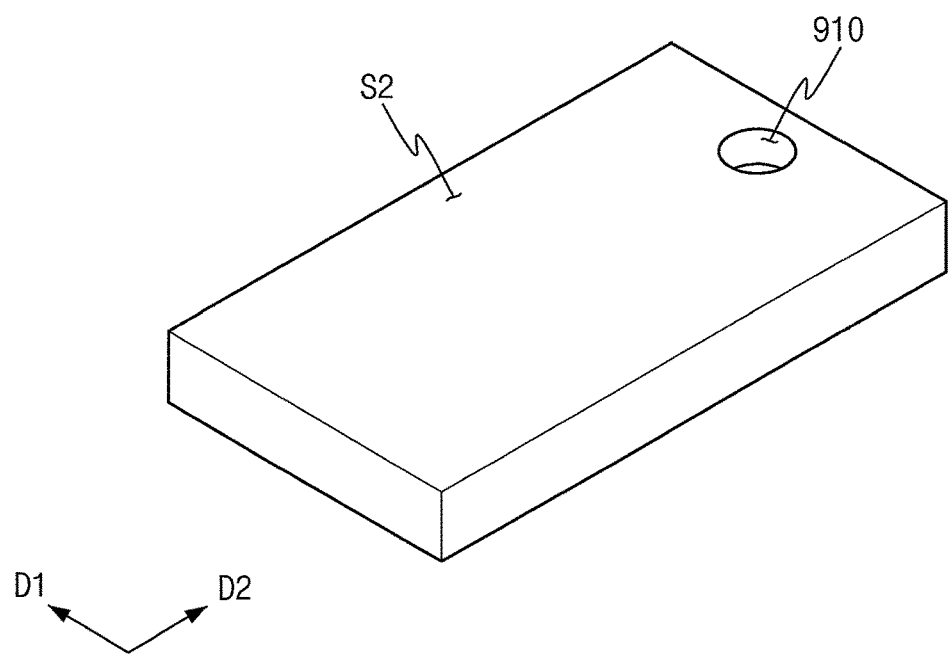

FIG. 1 is a perspective view showing an OLED device according to exemplary embodiments of the present invention. FIG. 2 is a plan view showing the OLED device of FIG. 1. FIGS. 3 and 4 are perspective views depicting an opening formed in the OLED device of FIG. 1.

Referring to FIGS. 1, 2, 3 and 4, the OLED device 100 may include a functional module 700 or the like. The OLED device 100 may have a first surface S1 to display an image and a second surface S2 opposite to the first surface S1. The functional module 700 may be disposed on one side (e.g., the first surface S1) of the OLED device 100.

As shown in FIG. 2, the OLED device 100 may include a display region 10, an opening region 20, a peripheral region 30, and a pad region 40. Herein, the peripheral region 30 may substantially surround the opening region 20, and the display region 10 may substantially surround the peripheral region 30. Alternatively, the display region 10 might not completely surround the peripheral region 30. As shown in FIGS. 3 and 4, the OLED device 100 may include an opening 910 formed in the opening region 20. The pad region 40 may be located at one side or end of the display region 10. A plurality of pad electrodes may be disposed in the pad region 40, and the pad electrodes may be electrically connected to an external device. In other exemplary embodiments, the OLED device 100 may further include a bending region located between the display region 10 and the pad region 40. For example, the bending region may be bent about an axis with respect to a first direction D1 that is parallel to an upper surface of the OLED device 100, and the pad region 40 may be located on a bottom surface of the OLED device 100.

The display region 10 may include a plurality of sub-pixel regions (not shown). The sub-pixel regions may be arrayed in the display region 10 to have a matrix form as a whole. A sub-pixel circuit (such as a semiconductor element 250 in FIG. 6) may be disposed in each of the sub-pixel regions of the display region 10, and an organic light emitting diode (such as a light emitting structure 200 in FIG. 6) may be disposed on the sub-pixel circuit. An image may be displayed on the display region 10 through the sub-pixel circuit and the organic light emitting diode.

For example, first, second, and third sub-pixel circuits may be disposed in the sub-pixel regions, and first, second, and third organic light emitting diodes may be disposed on the first to third sub-pixel circuits, respectively. The first sub-pixel circuit may be connected to the first organic light emitting diode capable of emitting red light, the second sub-pixel circuit may be connected to the second organic light emitting diode capable of emitting green light, and the third sub-pixel circuit may be connected to the third organic light emitting diode capable of emitting blue light.

In exemplary embodiments, the first organic light emitting diode may be disposed to overlap the first sub-pixel circuit, the second organic light emitting diode may be disposed to overlap the second sub-pixel circuit, and the third organic light emitting diode may be disposed to overlap the third sub-pixel circuit. Alternatively, the first organic light emitting diode may be disposed to overlap a part of the first sub-pixel circuit and a part of a sub-pixel circuit different from the first sub-pixel circuit, the second organic light emitting diode may be disposed to overlap a part of the second sub-pixel circuit and a part of a sub-pixel circuit different from the second sub-pixel circuit, and the third organic light emitting diode may be disposed to overlap a part of the third sub-pixel circuit and a part of a sub-pixel circuit different from the third sub-pixel circuit.

In other words, the first to third organic light emitting diodes may be arrayed using a scheme such as an RGB stripe type in which rectangles having the same size or substantially the same size are sequentially arrayed, an S-stripe type including a blue organic light emitting diode having a relatively large area, a WRGB type further including a white organic light emitting diode, and/or a PenTile arranged to have an RG-GB repetition pattern.

In addition, at least one driving transistor, at least one switching transistor, at least one capacitor or the like may be disposed in each of the sub-pixel regions.

Although the display region 10 of the present disclosure has been described to have a rectangular shape viewed from the top, the shape is not limited thereto. For example, the display region 10 may have a triangular shape, a rhombic shape, a polygonal shape, a circular shape, a track shape, or an oval shape viewed from the top (e.g., in plan view).

The functional module 700 may be disposed in the opening 910. For example, the functionality module 700 may include a camera module capable of photographing (or recognizing) an image of an object, a face recognition sensor module to sense a face of a user, a pupil recognition sensor module to sense a pupil of the user, an acceleration sensor module and a geomagnetic sensor module to determine movement of the OLED device 100, a proximity sensor module and an infrared sensor module to sense proximity of a user and/or an object to a front of the OLED device 100, and/or an illuminance sensor module to measure the degree of brightness when, for example, put in a bag. In other exemplary embodiments, a vibration module to indicate an incoming alarm, a speaker module to output sound, or the like may be disposed in the opening 910.

Although the shapes of the opening region 20 and the peripheral region 30 of the present invention have been described to have a circular shape viewed from the top, the shapes are not limited thereto. For example, the shape of the opening region 20 and the peripheral region 30 may have a triangular shape, a rhombic shape, a polygonal shape, a rectangular shape, a track shape, or an oval shape viewed from the top (e.g., in plan view).

Figure 5:
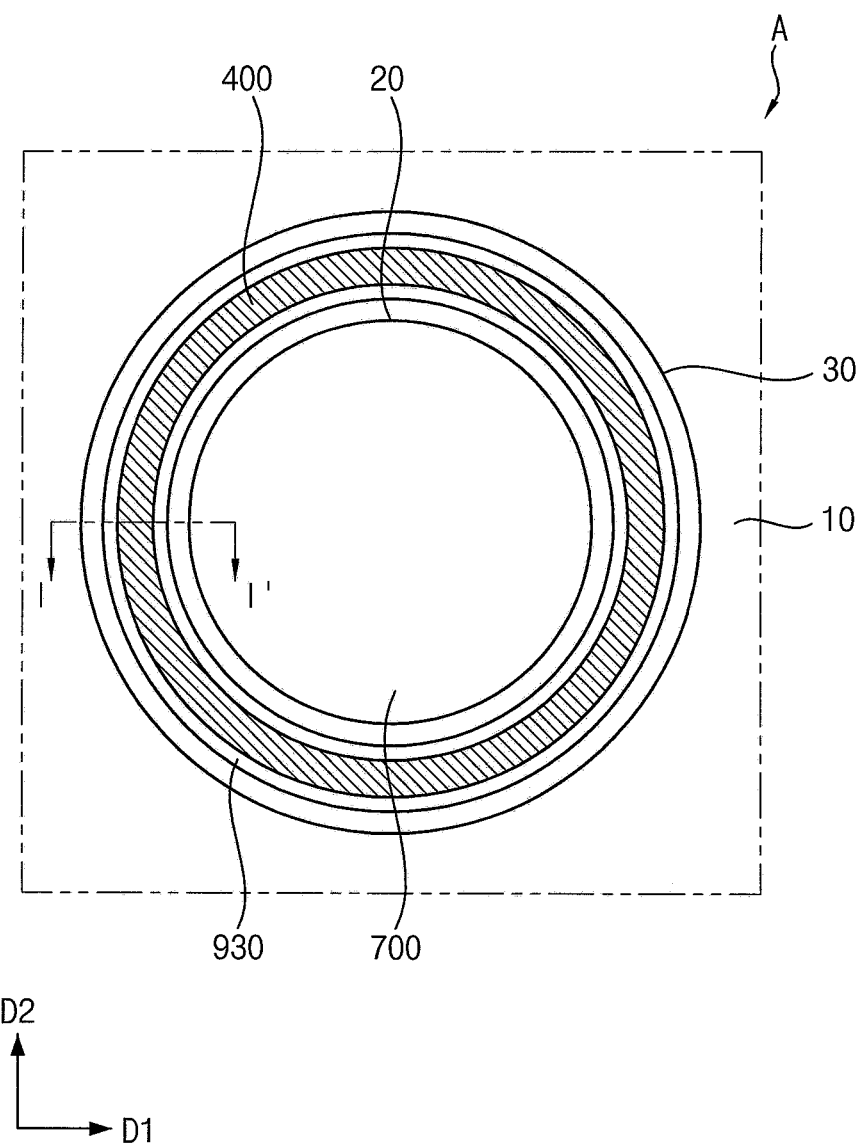
FIG. 5 is a partially enlarged plan view showing an 'A' region of the OLED device in FIG. 2.
Figure 6:
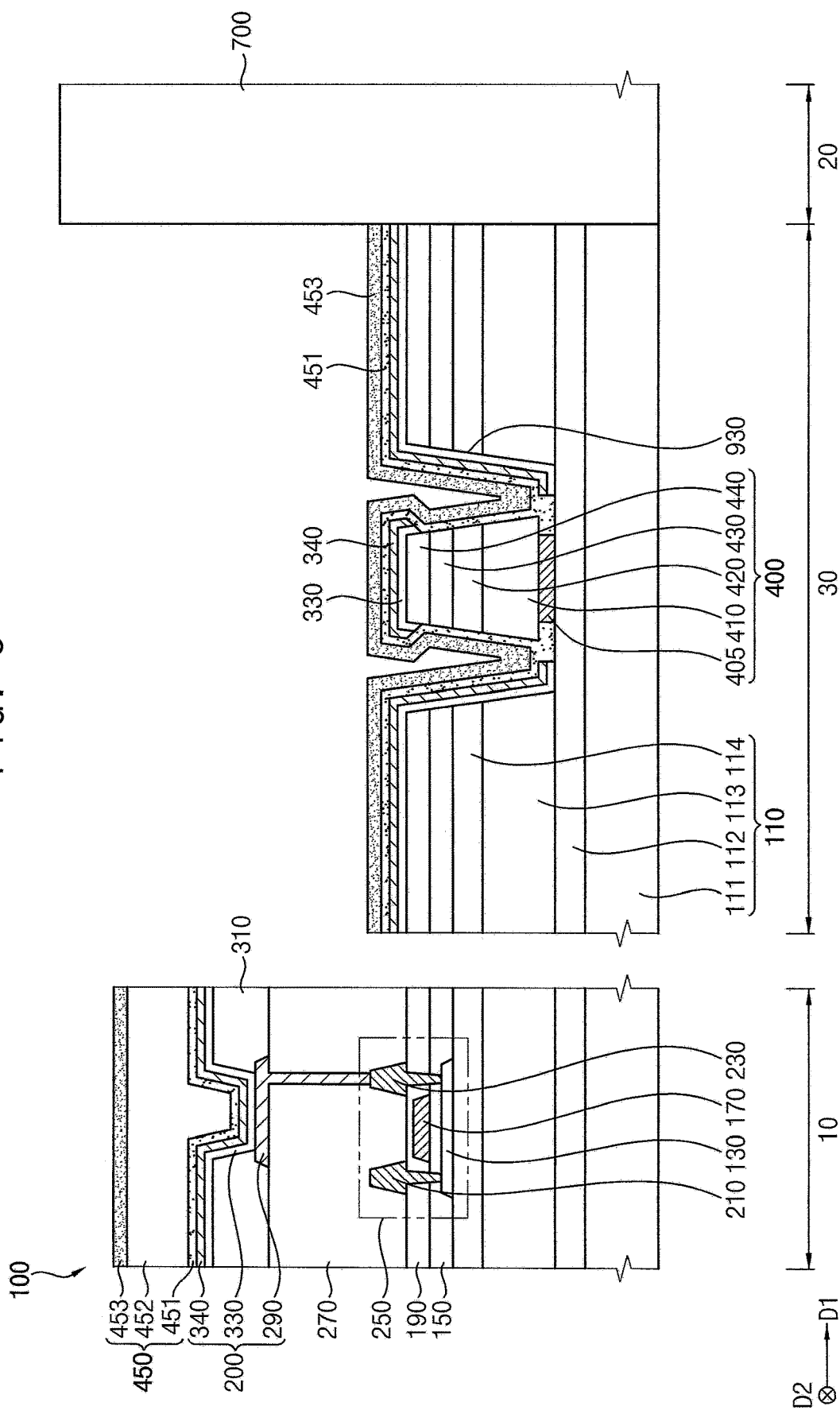
FIG. 6 is a sectional view taken along line I-I' of the OLED device in FIG. 5.

FIG. 5 is a partially enlarged plan view showing an 'A' region of the OLED device in FIG. 2. FIG. 6 is a sectional view taken along line I-I' of the OLED device in FIG. 5.

Referring to FIGS. 5 and 6, the OLED device 100 may include a substrate 110, an undercut structure 400, a semiconductor element 250, a planarization layer 270, a light emitting structure 200, a pixel defining layer 310, a thin film encapsulation structure 450, and a functional module 700. In some embodiments, the substrate 110 may include a first organic film layer 111, a first barrier layer 112, a second organic film layer 113, and a second barrier layer 114. As the OLED device 100 has the display region 10, the opening region 20, the peripheral region 30, and the pad region 40, the substrate 110 may also be divided into the display region 10, the opening region 20, the peripheral region 30, and the pad region 40. In addition, in some embodiments, the undercut structure 400 may include a sacrificial metal pattern 405, a first insulating layer pattern 410, a second insulating layer pattern 420, a third insulating layer pattern 430, and a fourth insulating layer pattern 440, and the semiconductor element 250 may include an active layer 130, a gate insulating layer 150, a gate electrode 170, an insulating interlayer 190, a source electrode 210, and a drain electrode 230. Further, the light emitting structure 200 may include a lower electrode 290, a light emitting layer 330, and an upper electrode 340, and the thin film encapsulation structure 450 may include a first thin encapsulation layer 451, a second thin encapsulation layer 452, and a third thin encapsulation layer 453.

In exemplary embodiments, the substrate 110 may further include a groove 930 formed in the peripheral region 30, and the undercut structure 400 may be disposed inside the groove 930 and spaced apart from an inner wall of the groove 930. In addition, each of the light emitting layer 330 and the upper electrode 340 may be spaced apart, inside the groove 930, by the undercut structure 400. In other words, each of the light emitting layer 330 and the upper electrode 340 may be short-circuited by the undercut structure 400 inside the groove 930. Accordingly, the OLED device 100 includes the light emitting layer 330 and the upper electrode 340 that are short-circuited by the undercut structure 400 inside the groove 930, such that moisture, humidity and the like may be prevented from permeating or penetrating into the semiconductor element 250 and the light emitting structure 200. Further, the substrate 110 may further include the opening 910 formed in the opening region 20, and the functional module 700 may be disposed in the opening 910 (see FIG. 16).

The first organic film layer 111 may be provided. The first organic film layer 111 may include a flexible organic material. For example, the first organic film layer 111 may include a random copolymer or a block copolymer. In addition, the first organic film layer 111 may have a high transparency, a low coefficient of thermal expansion, and a high glass transition temperature. Since the first organic film layer 111 contains an imide group, heat resistance, chemical resistance, abrasion resistance, and electrical characteristics may be high. In exemplary embodiments, the first organic film layer 111 may include polyimide.

The first barrier layer 112 may be entirely disposed on the first organic film layer 111. The first barrier layer 112 may block moisture permeating or penetrating through the first organic film layer 111. The first barrier layer 112 may include a flexible inorganic material. In exemplary embodiments, the first barrier layer 112 may include silicon oxide, silicon nitride, or the like. For example, the first barrier layer 112 may include silicon oxide (SiO), silicon nitride (SiN), silicon oxynitride (SiON), silicon oxycarbide (SiOC), silicon carbonitride (SiCN), aluminum oxide (AlO), aluminum nitride (AlN), tantalum oxide (TaO), hafnium oxide (HfO), zirconium oxide (ZrO), titanium oxide (TiO), and the like.

The second organic film layer 113 may be disposed on (e.g., directly on) the first barrier layer 112. In exemplary embodiments, the second organic film layer 113 may have a first opening 701 in the peripheral region 30 (see FIG. 11). For example, the first opening 701 may expose an upper surface of the first barrier layer 112 located in the peripheral region 30. The second organic film layer 113 may include a flexible organic material. For example, the second organic film layer 113 may include a random copolymer or a block copolymer. In exemplary embodiments, the second organic film layer 113 may include polyimide. Alternatively, a part of the second organic film layer 113 located in the peripheral region 30 may be partially removed, so that a trench is formed in the second organic film layer 113 located in the peripheral region 30 (e.g., the second organic film layer 113 may include a trench in the peripheral region 30 that does not extend completely through the second organic film layer 113). In such an embodiment, the upper surface of the first barrier layer 112 located in the peripheral region 30 might not be exposed.

The second barrier layer 114 may be disposed on (e.g., directly on) the second organic film layer 113. In exemplary embodiments, the second barrier layer 114 may have a second opening 702 that overlaps the first opening 701 in the peripheral region 30. In other words, the second opening 702 of the second barrier layer 114 may expose the upper surface of the first barrier layer 112 located in the peripheral region 30. The first opening 701 and the second opening 702 may be defined as a groove 930 in the substrate 110 (see FIG. 11). For example, as shown in FIG. 5, the groove 930 may have a hollow circular shape surrounding the opening 910 of the substrate 110 viewed from the top.

The second barrier layer 114 may block or at least mitigate against moisture permeating or penetrating through the second organic film layer 113. The second barrier layer 114 may include a flexible inorganic material. In exemplary embodiments, the second barrier layer 114 may include silicon oxide, silicon nitride, or the like.

Accordingly, the substrate 110 including the first organic film layer 111, the first barrier layer 112, the second organic film layer 113, and the second barrier layer 114 may be protected against moisture.

Although the substrate 110 has been described as having four layers, the configuration of the present disclosure is not limited thereto. For example, in other exemplary embodiments, the substrate 110 may include a single layer or at least two layers.

A buffer layer (not shown) may be disposed on (e.g., directly on) the substrate 110 (such as the second barrier layer 114). For example, the buffer layer may be entirely disposed in the display region 10 and the peripheral region 30 on the substrate 110, and the buffer layer may have an opening overlapping the groove 930 of the substrate 110. The buffer layer may prevent metal atoms or impurities from diffusing from the substrate 110 to the semiconductor element 250 and the light emitting structure 200, and enable a substantially uniform active layer to be obtained by adjusting the rate of heat transfer during a crystallization process to form the active layer. In addition, when the surface of the substrate 110 is not uniform, the buffer layer may serve to improve the flatness of the surface of the substrate 110. Depending on the type of substrate 110, at least two buffer layers may be provided on the substrate 110, or the buffer layer might not be provided. For example, the buffer layer may include an organic material or an inorganic material.

The active layer 130 may be disposed in the display region 10 on the substrate 110. The active layer 130 may include an oxide semiconductor, an inorganic semiconductor (such as amorphous silicon and poly silicon), an organic semiconductor, or the like. The active layer 130 may have source and drain regions.

The gate insulating layer 150 may be disposed on the active layer 130. The gate insulating layer 150 may cover the active layer 130 in the display region 10 on the substrate 110, extend in a direction from the display region 10 to the opening region 20 (such as the first direction D1), and be disposed in the peripheral region 30 on the substrate 110. In exemplary embodiments, the gate insulating layer 150 may have a third opening 703 (see FIGS. 9-11) that overlaps the groove 930 of the substrate 110 in the peripheral region 30. In other words, the gate insulating layer 150 may expose the upper surface of the first barrier layer 112 located in the peripheral region 30 through the third opening 703 (see FIG. 11). For example, the gate insulating layer 150 may sufficiently cover the active layer 130 in the display region 10 on the substrate 110, and have a substantially flat upper surface without generating a step around the active layer 130. Alternatively, the gate insulating layer 150 may cover the active layer 130 in the display region 10 on the substrate 110, and be disposed to have a uniform thickness along a profile of the active layer 130 such that a step is formed around the active layer 130. The gate insulating layer 150 may include a silicon compound, metal oxide, or the like. In some example embodiments, the gate insulating layer 150 may have a multi-layer structure including a plurality of insulating layers. For example, the insulating layers may have different thicknesses or include different materials.

The gate electrode 170 may be disposed in the display region 10 on the gate insulating layer 150. The gate electrode 170 may be disposed on a portion of the gate insulating layer 150 under which the active layer 130 is located. The gate electrode 170 may include a metal, an alloy, a metal nitride, a conductive metal oxide, a transparent conductive material, or the like. These may be used alone or in combination with each other. Alternatively, the gate electrode 170 may include a multi-layer structure including a plurality of layers.

The insulating interlayer 190 may be disposed on (e.g., directly on) the gate electrode 170. The insulating interlayer 190 may cover the gate electrode 170 in the display region 10 on the substrate 110, extend in the first direction D1, and be disposed in the peripheral region 30 on the substrate 110. In exemplary embodiments, the insulating interlayer 190 may have a fourth opening 704 (see FIGS. 9-11) that overlaps the third opening 703 in the peripheral region 30. In other words, the insulating interlayer 190 may expose the upper surface of the first barrier layer 112 located in the peripheral region 30 through the fourth opening 704 (see FIG. 11). For example, the insulating interlayer 190 may sufficiently cover the gate electrode 170 in the display region 10 on the gate insulating layer 150, and have a substantially flat upper surface without generating a step around the gate electrode 170. Alternatively, the insulating interlayer 190 may cover the gate electrode 170 in the display region 10 on the gate insulating layer 150, and be disposed to have a uniform thickness along a profile of the gate electrode 170 such that a step is formed around the gate electrode 170. The insulating interlayer 190 may include silicon compound, metal oxide, or the like. In some example embodiments, the insulating interlayer 190 may have a multi-layer structure including a plurality of insulating layers. For example, the insulating layers may have different thicknesses or include different materials.

The source electrode 210 and the drain electrode 230 may be disposed in the display region 10 on the insulating interlayer 190. The source electrode 210 may be connected to the source region of the active layer 130 through a contact hole formed by removing a first portion of the gate insulating layer 150 and the insulating interlayer 190, and the drain electrode 230 may be connected to the drain region of the active layer 130 through a contact hole formed by removing a second portion of the gate insulating layer 150 and the insulating interlayer 190. The source electrode 210 and the drain electrode 230 each may include a metal, an alloy, a metal nitride, a conductive metal oxide, a transparent conductive material, or the like. These may be used alone or in combination with each other. In other exemplary embodiments, the source electrode 210 and the drain electrode 230 each may have a multi-layer structure including a plurality of layers.

Accordingly, the semiconductor element 250 including the active layer 130, the gate insulating layer 150, the gate electrode 170, the insulating interlayer 190, the source electrode 210, and the drain electrode 230 may be disposed between the substrate 110 and the light emitting structure 200.

Although the semiconductor element 250 has been described as having an upper gate structure, the configuration of the present invention is not limited thereto. For example, the semiconductor element 250 may have a lower gate structure, a double gate structure, or the like.

In addition, although the OLED device 100 is described as including one semiconductor element, the configuration of the present invention is not limited thereto. For example, the OLED device 100 may include at least one semiconductor element and at least one storage capacitor.

In some embodiments, the sacrificial metal pattern 405 may be disposed inside the groove 930 of the substrate 110. In other words, the sacrificial metal pattern 405 may be disposed on the upper surface of the first barrier layer 112 exposed through the first opening 701 of the second organic film layer 113, the second opening 702 of the second barrier layer 114, the third opening 703 of the gate insulating layer 150, and the fourth opening 704 of the first insulating interlayer 190. Alternatively, the sacrificial metal pattern 405 may be disposed on the first organic film layer 111, the second organic film layer 113, the second barrier layer 114, or the gate insulating layer 150.

Figure 11:
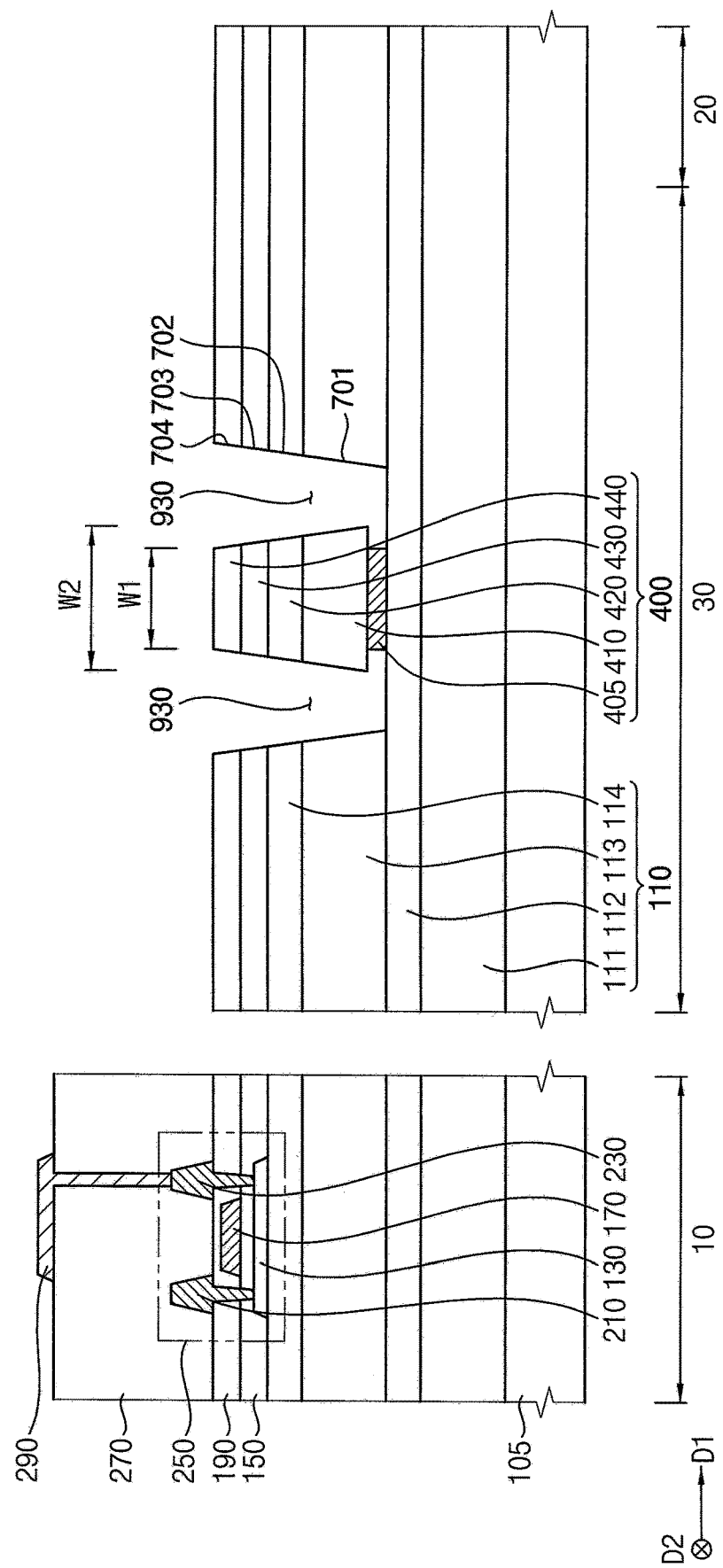

In exemplary embodiments, the sacrificial metal pattern 405 may have a first width W1, and may be spaced apart from an inner wall of the groove 930 (see FIG. 11). In addition, the sacrificial metal pattern 405 may be spaced apart from the light emitting layer 330 and the upper electrode 340 disposed in the groove 930 (or the peripheral region 30). In other words, the sacrificial metal pattern 405 might not be in direct contact with the light emitting layer 330 and the upper electrode 340. Further, the top surface of the sacrificial metal pattern 405 may be in contact with the first insulating layer pattern 410, the bottom surface of the sacrificial metal pattern 405 may be in contact with the first barrier layer 112, and both side surfaces of the sacrificial metal pattern 405 may be in direct contact with the first thin-film encapsulation layer 451 (see FIG. 14).

The sacrificial metal pattern 405 may include a metal, an alloy, a metal nitride, a conductive metal oxide, a transparent conductive material, or the like. For example, the sacrificial metal pattern 405 may include gold (Au), silver (Ag), aluminum (Al), tungsten (W), copper (Cu), platinum (Pt), nickel (Ni), titanium (Ti), palladium (Pd), magnesium (Mg), calcium (Ca), lithium (Li), chromium (Cr), tantalum (Ta), molybdenum (Mo), scandium (Sc), neodymium (AlN), iridium (Ir), an alloy containing aluminum, aluminum nitride (AlN), an alloy containing silver, tungsten nitride (WN), an alloy containing copper, an alloy containing molybdenum, titanium nitride (TiN), tantalum nitride (TaN), strontium ruthenium oxide (SrRuO), zinc oxide (ZnO), indium tin oxide (ITO), tin oxide (SnO), indium oxide (InO), gallium oxide (GaOx), indium zinc oxide (IZO), or the like. These may be used alone or in combination with each other. In exemplary embodiments, the sacrificial metal pattern 405 may include a material etched by an etchant used to pattern the lower electrode 290 (such as an etchant used in the process of selectively etching a preliminary lower electrode to form the lower electrode). For example, the sacrificial metal pattern 405 may be composed of molybdenum. In other exemplary embodiments, the sacrificial metal pattern 405 may have a multi-layer structure including a plurality of layers.

The first insulating layer pattern 410 may be disposed on (e.g., directly on) the sacrificial metal pattern 405. The first insulating layer pattern 410 may be disposed inside the groove 930. In exemplary embodiments, the first insulating layer pattern 410 may have a second width W2 greater than the first width W1 of the sacrificial metal pattern 405, and may be spaced apart from an inner wall of the groove 930 (see FIG. 11). In addition, the first insulating layer pattern 410 may be located at the same layer of the display device as the second organic film layer 113. The first insulating layer pattern 410 may include a flexible organic material. For example, the first insulating layer pattern 410 may include a random copolymer or a block copolymer. In exemplary embodiments, the first insulating layer pattern 410 may include polyimide.

The second insulating layer pattern 420 may be disposed on (e.g., directly on) the first insulating layer pattern 410. The second insulating layer pattern 420 may be disposed inside the groove 930. In exemplary embodiments, the width of the second insulation layer pattern 420 may be greater than the first width W1 of the sacrificial metal pattern 405, and may be spaced apart from an inner wall of the groove 930 (see FIG. 11). In addition, the second insulating layer pattern 420 may be located at the same layer of the display device as the second barrier layer 114. Alternatively, the width of the second insulating layer pattern 420 may be equal to or smaller than the first width W1 of the sacrificial metal pattern 405. The second insulating layer pattern 420 may include a flexible inorganic material. In exemplary embodiments, the second insulating layer pattern 420 may include silicon oxide, silicon nitride, or the like.

The third insulating layer pattern 430 may be disposed on (e.g., directly on) the second insulating layer pattern 420. The third insulating layer pattern 430 may be disposed inside the third opening 703. In exemplary embodiments, the width of the third insulating layer pattern 430 may be greater than the first width W1 of the sacrificial metal pattern 405, and may be spaced apart from an inner wall of the third opening 703 (see FIG. 11). In addition, the third insulating layer pattern 430 may be located at the same layer of the display device as the gate insulating layer 150. Alternatively, the width of the third insulating layer pattern 430 may be equal to or smaller than the first width W1 of the sacrificial metal pattern 405. The third insulating layer pattern 430 may include silicon compound, metal oxide, or the like.

The fourth insulating layer pattern 440 may be disposed on (e.g., directly on) the third insulating layer pattern 430. The fourth insulating layer pattern 440 may be disposed inside the fourth opening 704. In exemplary embodiments, a width of the fourth insulating layer pattern 440 may be greater than the first width W1 of the sacrificial metal pattern 405, and may be spaced apart from an inner wall of the fourth opening 704 (see FIG. 11). In addition, the fourth insulating layer pattern 440 may be located at the same layer of the display device as the insulating interlayer 190. Alternatively, the width of the fourth insulating layer pattern 440 may be equal to or smaller than the first width W1 of the sacrificial metal pattern 405. The fourth insulating layer pattern 440 may include silicon compound, metal oxide, or the like.

Accordingly, the undercut structure 400, which includes the sacrificial metal pattern 405, the first insulating layer pattern 410, the second insulating layer pattern 420, the third insulating layer pattern 430, and the fourth insulating layer pattern 440, may be disposed inside the groove 930. As the undercut structure 400 is disposed inside the groove 930, the undercut structure 400 may also have a hollow circular shape surrounding the opening 910 viewed from the top (e.g., in plan view) (see FIG. 5).

In exemplary embodiments of the present disclosure, as the sacrificial metal pattern 405 has the width smaller than that of the first insulating layer pattern 410, the groove 930 may have an undercut shape (e.g., the groove 930 extends under a portion of the first insulating layer pattern 410). The groove 930 (such as the first opening 701 and the second opening 702), the third opening 703, the fourth opening 704, and the undercut structure 400 may function as a shielding pattern to shield the moisture and/or humidity from being permeated from or penetrating from the opening region 20 into the display region 10. In other exemplary embodiments, a plurality of the shielding patterns may be formed between the groove 930 and the functional module 700, and the shielding patterns may be formed between the light emitting structure 200, which is located adjacent to a boundary between the display region 10 and the peripheral region 30, and the groove 930.

The planarization layer 270 may be disposed on the insulating interlayer 190, the source electrode 210, and the drain electrode 230. The planarization layer 270 may cover, in the display region 10, the source electrode 210 and the drain electrode 230 on the insulating interlayer 190, and the planarization layer 270 might not be disposed in the peripheral region 30. In other words, the planarization layer 270 may be disposed only in the display region 10 on the insulating interlayer 190. For example, the planarization layer 270 may have a relatively large thickness in the display region 10. In such an embodiment, the planarization layer 270 may have a substantially planarized upper surface, and a planarization process may be added with respect to the planarization layer 270 to implement the above planarized upper surface of the planarization layer 270. Alternatively, the planarization layer 270 may be disposed to have a uniform thickness along profiles of the source electrode 210 and the drain electrode 230 in the display region 10 on the insulating interlayer 190 such that one or more steps are formed. The planarization layer 270 may be formed of an organic material or an inorganic material. In exemplary embodiments, the planarization layer 270 may include photoresist, polyacryl-based resin, polyimide-based resin, polyamide-based resin, siloxane-based resin, acryl-based resin, and epoxy-based resin.

The lower electrode 290 may be disposed in the display region 10 on (e.g., directly on) the planarization layer 270. The lower electrode 290 may be connected to the drain electrode 230 through a contact hole formed by removing a part of the planarization layer 270, and the lower electrode 290 may be electrically connected to the semiconductor element 250. The lower electrode 290 may include a metal, an alloy, a metal nitride, a conductive metal oxide, a transparent conductive material, or the like. These may be used alone or in combination with each other. In exemplary embodiments, the lower electrode 290 may have a multi-layer structure including a plurality of layers. For example, the lower electrode 290 may have a multi-layer structure in which indium tin oxide, silver, and indium tin oxide are sequentially stacked.

The pixel defining layer 310 (see FIG. 12) may be disposed in the display region 10 on (e.g., directly on) the planarization layer 270, and might not be disposed in the peripheral region 30. In other words, the pixel defining layer 310 may be disposed only in the display region 10 on the planarization layer 270. For example, the pixel defining layer 310 may expose a part of the upper surface of the lower electrode 290 while covering both side portions of the lower electrode 290. The pixel defining layer 310 may be formed of an organic material or an inorganic material. In exemplary embodiments, the pixel defining layer 310 may include an organic material.

The light emitting layer 330 may be disposed on the pixel defining layer 310 and the lower electrode 290 in the display region 10, may extend in the first direction D1, and may be disposed in the peripheral region 30 on the substrate 110. In exemplary embodiments, the light emitting layer 330 may be partially disposed inside the groove 930, and may be spaced apart from another portion of the light emitting layer 330 by the undercut structure 400 in the depth direction at a portion where the groove 930 is located (for example, a direction from the second barrier layer 114 to the first organic film layer 111). In other words, the light emitting layer 330 may be short-circuited by the undercut structure 400 in the peripheral region 30. That is, the light emitting layer 330 may be separated or divided in the peripheral region 30 by the groove 930, the third opening 703, the fourth opening 704 and the undercut structure 400.

In contrast, if the undercut structure 400 including the sacrificial metal pattern 405 having the first width W1 was not provided in the groove 930, the light emitting layer 330 would be continuously disposed at a portion where the groove 930 is formed, and the light emitting layer 330 could function as a permeation path for moisture and/or humidity. In other words, a part of the light emitting layer 330 (such as a side end portion of the light emitting layer 330) would be exposed in the opening region 20, and the moisture and/or humidity could permeate into the exposed part of the light emitting layer 330. In this case, the semiconductor element 250 and the light emitting structure 200 disposed in the display region 10 positioned adjacent to the peripheral region 30 may be damaged by the moisture and/or humidity. However, in exemplary embodiments of the present invention, since the OLED device 100 includes the undercut structure 400, the light emitting layer 330 may be separated or divided at the inside of the groove 930. In other words, the light emitting layer 330 is separated or divided at the inside of the groove 930, such that the moisture permeation path of the light emitting layer 330 may be blocked. Accordingly, pixel defects of the OLED device 100 might not occur even when the light emitting layer 330 is disposed in the peripheral region 30.

The light emitting layer 330 may have a multi-layered structure including an organic light emitting or emissive layer ("EML"), a hole injection layer ("HIL"), a hole transport layer ("HTL"), an electron transport layer ("ETL"), an electron injection layer ("EIL"), and the like. In exemplary embodiments, the EML, the HIL, the HTL, the ETL and the EIL may be disposed in the peripheral region 30. In other exemplary embodiments, the HIL, the HTL, the ETL and the EIL other than the EML may be disposed in the peripheral region 30.

The EML of the light emitting layer 330 may be formed using at least one of light emitting materials capable of emitting different color lights (such as red light, green light, and blue light) according to sub-pixels. In some embodiments, the EML of the light emitting layer 330 may be formed by laminating a plurality of light emitting materials capable of generating different color lights such as red light, green light, and blue light, such that white light may be emitted as a whole. In such an embodiment, a color filter also may be disposed on the light emitting layer 330 disposed on the lower electrode 290. The color filter may include at least one of a red color filter, a green color filter, and a blue color filter. Alternatively, the color filter may also include a yellow color filter, a cyan color filter, and a magenta color filter. The color filter may include photosensitive resin or color photoresist.

The upper electrode 340 may overlap the light emitting layer 330 in the display region 10, extend in the first direction D1, and be disposed in the peripheral region 30 on the light emitting layer 330. In exemplary embodiments, the upper electrode 340 may be partially disposed inside the groove 930, and may be spaced apart from another portion of the upper electrode 340 in the depth direction at the portion where the groove 930 is located (e.g., the upper electrode 340 may be separated or divided at the groove 930). In other words, the upper electrode 340 may be short-circuited by the undercut structure 400 in the peripheral region 30 of the upper electrode 340. That is, a portion of the upper electrode 340 may be separated or divided in the peripheral region 30 by the groove 930, the third opening 703, the fourth opening 704 and the undercut structure 400.

In contrast, if the undercut structure 400 including the sacrificial metal pattern 405 having the first width W1 was not provided in the groove 930, the upper electrode 340 would be continuously disposed at a portion where the groove 930 is formed, and the upper electrode 340 could function as a permeation path for moisture and/or humidity. In other words, a part of the upper electrode 340 (such as a side end portion of the upper electrode 340) would be exposed in the opening region 20, and the moisture and/or humidity could permeate into the exposed part of the upper electrode 340. In this case, the semiconductor element 250 and the light emitting structure 200 disposed in the display region 10 positioned adjacent to the peripheral region 30 may be damaged by the moisture and/or humidity. However, in exemplary embodiments of the present disclosure, since the OLED device 100 includes the undercut structure 400, the upper electrode 340 may be separated or divided at the groove 930. In other words, the upper electrode 340 is separated or divided at the inside of the groove 930, such that the moisture permeation path of the upper electrode 340 may be blocked. Accordingly, pixel defects of the OLED device 100 might not occur even when the upper electrode 340 is disposed in the peripheral region 30.

The upper electrode 340 may include a metal, an alloy, a metal nitride, a conductive metal oxide, a transparent conductive material, or the like. These may be used alone or in combination with each other. In other exemplary embodiments, the upper electrode 340 may have a multi-layer structure including a plurality of layers.

Accordingly, the light emitting structure 200 including the lower electrode 290, the light emitting layer 330, and the upper electrode 340 may be protected against moisture.

A capping layer (not shown) may be disposed on the upper electrode 340. The capping layer may overlap the upper electrode 340 in the display region 10, extend in the first direction D1, and be disposed in the peripheral region 30 on the upper electrode 340. In exemplary embodiments, the capping layer may be partially disposed inside the groove 930, and may be spaced apart from another portion of the capping layer in the depth direction at the portion where the groove 930 is located. In other words, the capping layer may be short-circuited by the undercut structure 400 in the peripheral region 30. That is, the capping layer may be separated or divided at the peripheral region 30 by the groove 930, the third opening 703, the fourth opening 704 and the undercut structure 400.

In contrast, if the groove 930 did not have the undercut structure 400 including the sacrificial metal pattern 405 having the first width W1, the capping layer would be continuous at the portion where the groove 930 is formed, and the capping layer could function as a permeation path for moisture and/or humidity. In other words, a part of the capping layer (such as a side end portion of the capping layer) would be exposed in the opening region 20, and the moisture and/or humidity could permeate into the exposed part of the capping layer. In this case, the semiconductor element 250 and the light emitting structure 200 disposed in the display region 10 positioned adjacent to the peripheral region 30 may be damaged by the moisture and/or humidity. However, in exemplary embodiments of the present invention, since the OLED device 100 includes the undercut structure 400, the capping layer may be separated or divided at the groove 930. That is, the capping layer is separated or divided at the inside of the groove 930, such that the moisture permeation path of the capping layer may be blocked. Accordingly, pixel defects of the OLED device 100 might not occur even when the capping layer is disposed in the peripheral region 30.

The capping layer may protect the light emitting structure 200, and include an organic material or an inorganic material. In exemplary embodiments, the capping layer may include an organic material such as a triamine derivative, an arylenediamine derivative, 4,4'-N,N'-dicarbazole-biphenyl (4,4'-bis(N-carbazolyl)-1,1'-biphenyl (CBP)), and tris-8-hydroxyquinoline aluminum (Alq3).

The first thin film encapsulation layer 451 may be disposed in the display region 10 and the peripheral region 30 on the upper electrode 340. The first thin film encapsulation layer 451 may cover the upper electrode 340 in the display region 10, be disposed to have a uniform thickness along a profile of the upper electrode 340, and extend to the peripheral region 30. The first thin film encapsulation layer 451 may be disposed along the profile of the upper electrode 340 in the peripheral region 30. In other words, the first thin film encapsulation layer 451 may be continuously disposed at the portion where the groove 930 is formed. In exemplary embodiments, the first thin film encapsulation layer 451 may completely cover the groove 930 and the undercut structure

400. In other words, the first thin film encapsulation layer 451 may be in direct contact with both side portions of the sacrificial metal pattern 405. The first thin film encapsulation layer 451 may prevent the light emitting structure 200 from deteriorating due to the permeation of the moisture, oxygen, or the like. In addition, the first thin film encapsulation layer 451 may also function to protect the light emitting structure 200 from an external impact. The first thin film encapsulation layer 451 may include flexible inorganic materials.

The second thin film encapsulation layer 452 may be disposed in the display region 10 on the first thin film encapsulation layer 451, and the second thin film encapsulation layer 452 may not be disposed in the peripheral region 30. In other words, the second thin film encapsulation layer 452 may be disposed only in the display region 10. Alternatively, the second thin film encapsulation layer 452 may be disposed in a part of the peripheral region 30. The second thin film encapsulation layer 452 may improve the flatness of the OLED device 100 and protect the light emitting structure 200. The second thin film encapsulation layer 452 may include flexible organic materials.

The third thin film encapsulation layer 453 may be disposed in the display region 10 on the second thin film encapsulation layer 452 and the peripheral region 30 on the first thin film encapsulation layer 451. The third thin film encapsulation layer 451 may cover the second thin film encapsulation layer 451 in the display region 10, may be disposed to have a uniform thickness along a profile of the second thin film encapsulation layer 452, and may extend to the peripheral region 30. The third thin film encapsulation layer 453 may be disposed along a profile of the first thin film encapsulation layer 451 in the peripheral region 30. In other words, the third thin film encapsulation layer 453 may be continuous at the portion where the groove 930 is formed. The third thin film encapsulation layer 453 may prevent the light emitting structure 200 from deteriorating due to the permeation of the moisture, oxygen, or the like, together with the first thin film encapsulation layer 451. In addition, together with the first thin film encapsulation layer 451 and the second thin film encapsulation layer 452, the third thin film encapsulation layer 453 may also function to protect the light emitting structure 200 from the external impact. The third thin film encapsulation layer 453 may include flexible inorganic materials.

Accordingly, in some embodiments, the thin film encapsulation structure 450 may include the first thin film encapsulation layer 451, the second thin film encapsulation layer 452, and the third thin film encapsulation layer 453. Alternatively, the thin film encapsulation structure 450 may be a five-layer structure laminated with first to fifth thin film encapsulation layers or a seven-layer structure laminated with first to seventh thin film encapsulation layers.

The functional module 700 may be disposed in the opening region 20. In exemplary embodiments, the functional module 700 may be in contact with a side surface of the substrate 110, a side surface of the light emitting layer 330, a side surface of the upper electrode 340, a side surface of the first thin film encapsulation layer 451, and a side surface of the third thin film encapsulation layer 453 at a boundary between the peripheral region 30 and the opening region 20. For example, in one or more embodiments, the functional module 700 may include a camera module, a face recognition sensor module, a pupil recognition sensor module, an acceleration sensor module and a geomagnetism sensor module, a proximity sensor module and an infrared sensor module, an illuminance sensor module, a vibration module, and/or a speaker module.

The OLED device 100 according to the exemplary embodiments of the present disclosure includes the undercut structure 400 disposed inside the groove 930, so that the OLED device 100 can prevent or at least mitigate against moisture, humidity and the like from permeating into the semiconductor element 250 and the light emitting structure 200 from the peripheral region 30 to the display region 10.

FIGS. 7 to 17 are sectional views describing a method of manufacturing an OLED device according to exemplary embodiments of the present invention.

Figure 7:
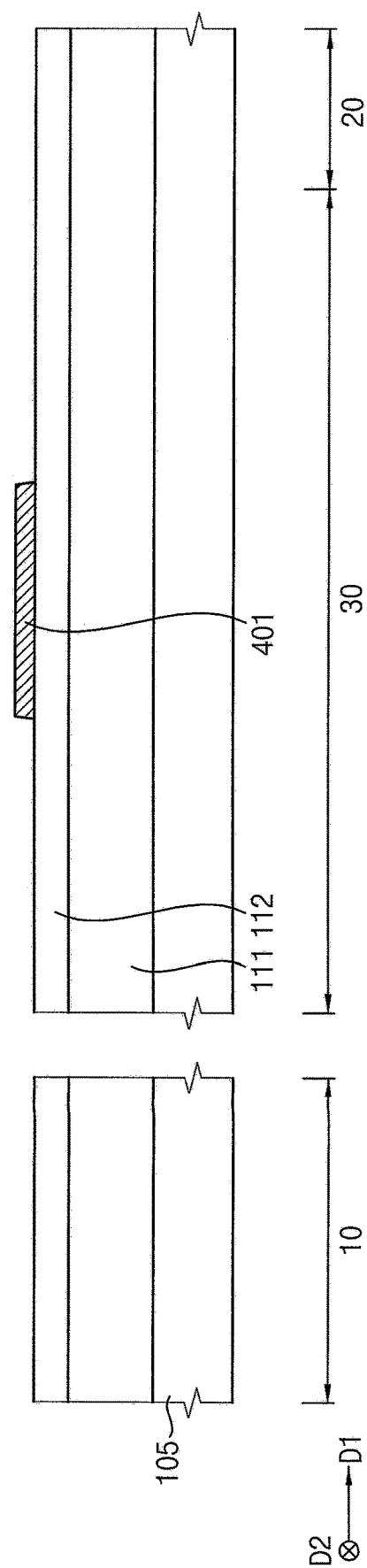
FIGS. 7 to 17 are sectional views describing a method of manufacturing an OLED device according to exemplary embodiments of the present invention.

Referring to FIG. 7, a rigid glass substrate 105 may be provided or obtained. A first organic film layer 111 may be formed on the glass substrate 105. The first organic film layer 111 may be formed entirely on the glass substrate 105, and may be formed by using a flexible organic material such as polyimide.

A first barrier layer 112 may be formed entirely on the first organic film layer 111. The first barrier layer 112 may block or at least mitigate against moisture permeating or penetrating through the first organic film layer 111. The first barrier layer 112 may be formed by using a flexible inorganic material such as silicon oxide and silicon nitride. For example, the first barrier layer 112 may include SiO, SiN, SiON, SiOC, SiCN, AlO, AlN, TaO, HfO, ZrO, TiO, and the like.

A preliminary sacrificial metal pattern 401 may be formed in the peripheral region 30 on the first barrier layer 112. The preliminary sacrificial metal pattern 401 may be formed by using a metal, an alloy, a metal nitride, a conductive metal oxide, a transparent conductive material, or the like. For example, the preliminary sacrificial metal pattern 401 may include Au, Ag, Al, W, Cu, Pt, Ni, Ti, Pd, Mg, Ca, Li, Cr, Ta, Mo, Sc, AlN, Ir, an alloy containing aluminum, AlN, an alloy containing silver, WN, an alloy containing copper, an alloy containing molybdenum, TiN, TaN, SrRuO, ZnO, ITO, SnO, InO, GaOx, IZO, or the like. These may be used alone or in combination with each other. In exemplary embodiments, the preliminary sacrificial metal pattern 401 may include a material etched by an etchant used to pattern the lower electrode (such as an etchant used in the process of selectively etching a preliminary lower electrode to form the lower electrode), which will be described later. For example, the preliminary sacrificial metal pattern 401 may be composed of molybdenum. In other exemplary embodiments, the preliminary sacrificial metal pattern 401 may have a multi-layer structure including a plurality of layers.

Figure 8:
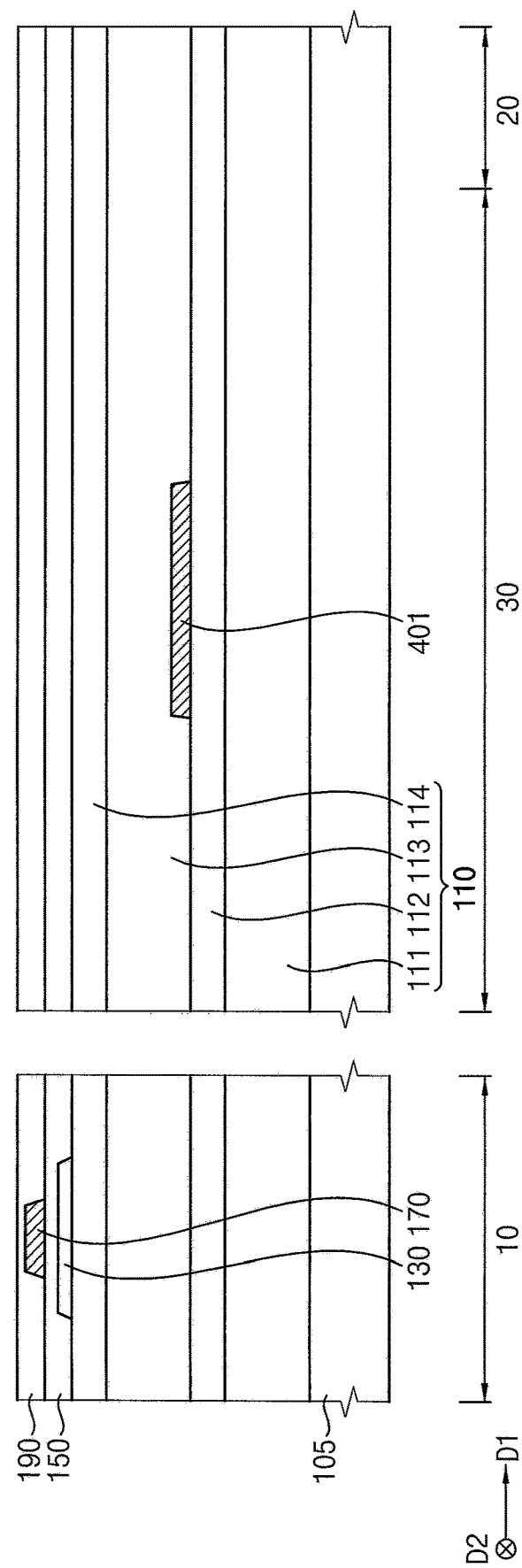

Referring to FIG. 8, a second organic film layer 113 may be formed on the first barrier layer 112. The second organic film layer 113 may be formed entirely on the first barrier layer 112, and may be formed by using a flexible organic material such as polyimide. For example, the second organic film layer 113 may sufficiently cover the preliminary sacrificial metal pattern 401 in the peripheral region 30 on the first barrier layer 112, and may have a substantially flat upper surface without generating a step around the preliminary sacrificial metal pattern 401. Alternatively, the second organic film layer 113 may cover the preliminary sacrificial metal pattern 401 in the peripheral region 30 on the first barrier layer 112, and may be formed to have a uniform thickness along a profile of the preliminary sacrificial metal pattern 401 such that a step around the preliminary sacrificial metal pattern 401 is formed.

A second barrier layer 114 may be formed entirely on the second organic film layer 113. The second barrier layer 114 may block or at least mitigate against moisture permeating or penetrating through the second organic film layer 113.

The second barrier layer 114 may be formed by using a flexible inorganic material such as silicon oxide and silicon nitride.

Accordingly, in one or more embodiments, a substrate 110 may be formed including the first organic film layer 111, the first barrier layer 112, the second organic film layer 113, and the second barrier layer 114.

Since the substrate 110 is thin and flexible, the substrate 110 may be formed on a rigid glass substrate 105 to support the formation of an upper structure (such as the semiconductor element and the light emitting structure). For example, after the upper structure is formed on the substrate 110, the glass substrate 105 may be removed. In other words, because of the flexible physical properties of the first organic film layer 111, the first barrier layer 112, the second organic film layer 113, and the second barrier layer 114, it may be difficult to directly form the upper structure on the first organic film layer 111, the first barrier layer 112, the second organic film layer 113, and the second barrier layer 114. On the basis of the above difficulty, the first organic film layer 111, the first barrier layer 112, the second organic film layer 113, and the second barrier layer 114 may be used as the substrate 110 by using the glass substrate 105 to form the upper structure and then removing the glass substrate 105.

A buffer layer (not shown) may be formed on the substrate 110. The buffer layer may be formed entirely on the substrate. The buffer layer may prevent metal atoms or impurities from being diffused from the substrate 110, and may enable a substantially uniform active layer to be obtained by adjusting the rate of heat transfer during a crystallization process to form the active layer. In addition, when a surface of the substrate 110 is not uniform, the buffer layer may serve to improve the flatness of the surface of the substrate 110. Depending on the type of substrate 110, at least two buffer layers may be provided on the substrate 110, or the buffer layer might not be formed. For example, the buffer layer may be formed by using an organic material or an inorganic material.

An active layer 130 may be formed in the display region 10 on the substrate 110. The active layer 130 may be formed by using an oxide semiconductor, an inorganic semiconductor, an organic semiconductor, or the like. The active layer 130 may have source and drain regions.

A gate insulating layer 150 may be formed on the active layer 130. The gate insulating layer 150 may cover the active layer 130 in the display region 10 on the substrate 110, and extend in the first direction D1, which is the direction from the display region 10 to the opening region 20 in the gate insulating layer 150. In other words, the gate insulating layer 150 may be formed entirely on the substrate 110. For example, the gate insulating layer 150 may sufficiently cover the active layer 130 on the substrate 110, and have a substantially flat upper surface without generating a step around the active layer 130. Alternatively, the gate insulating layer 150 may cover the active layer 130 on the substrate 110, and may be formed to have a uniform thickness along the profile of the active layer 130 such that a step around the active layer 130 is formed. The gate insulating layer 150 may be formed by using silicon compound, metal oxide, or the like. In some example embodiments, the gate insulating layer 150 may have a multi-layer structure including a plurality of insulating layers. For example, the insulating layers may have different thicknesses or include different insulating materials.

A gate electrode 170 may be formed in the display region 10 on the gate insulating layer 150. The gate electrode 170 may be formed on a portion of the gate insulating layer 150 below which the active layer 130 is located. The gate electrode 170 may be formed by using a metal, an alloy, a metal nitride, a conductive metal oxide, a transparent conductive material, or the like. These may be used alone or in combination with each other. Alternatively, the gate electrode 170 may include a multi-layer structure including a plurality of layers.

An insulating interlayer 190 may be formed on the gate electrode 170. The insulating interlayer 190 may cover the gate electrode 170 in the display region 10 on the gate insulating layer 150, and may extend in the first direction D1 on the gate insulating layer 150. In other words, the insulating interlayer 190 may be formed entirely on the gate insulating layer 150. For example, the insulating interlayer 190 may sufficiently cover the gate electrode 170 on the gate insulating layer 150, and may have a substantially flat upper surface without generating a step around the gate electrode 170. Alternatively, the insulating interlayer 190 may cover the gate electrode 170 on the gate insulating layer 150, and may be formed to have a uniform thickness along the profile of the gate electrode 170 such that a step is formed around the gate electrode 170. The insulating interlayer 190 may be formed by using silicon compound, metal oxide, or the like. Alternatively, the insulating interlayer 190 may have a multi-layer structure including a plurality of insulating layers. For example, the insulating layers may have different thicknesses or include different insulating materials.

Figure 9:
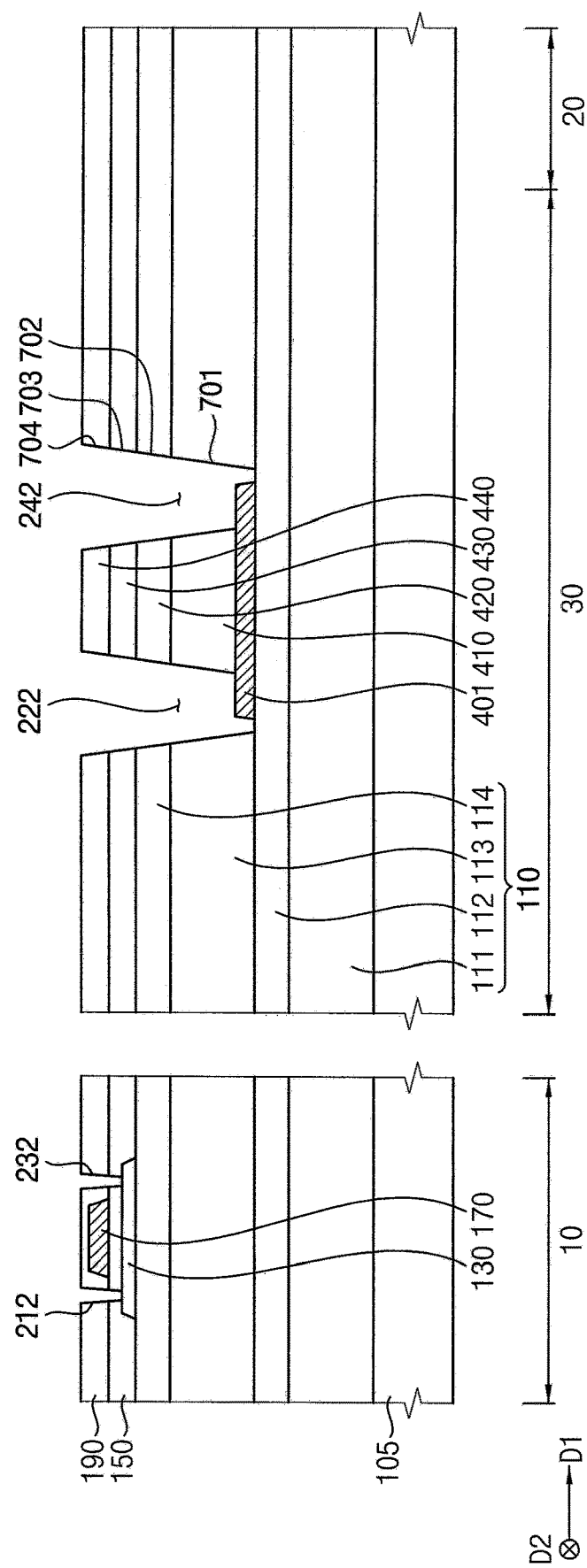

Referring to FIG. 9, in the display region 10, a first contact hole 212 exposing the source region of the active layer 130 may be formed by removing first portions of the gate insulating layer 150 and the insulating interlayer 190, and a second contact hole 232 exposing the drain region of the active layer 130 may be formed by removing second portions of the gate insulating layer 150 and the insulating interlayer 190. In addition, in the peripheral region 30, a third contact hole 222 exposing a third portion of the preliminary sacrificial metal pattern 401 may be formed by removing the first portions of the insulating interlayer 190, the gate insulating layer 150, the second barrier layer 114, and the second organic film layer 113, and a fourth contact hole 242 exposing a fourth portion of the preliminary sacrificial metal pattern 401 may be formed by removing second portions of the insulating interlayer 190, the gate insulating layer 150, the second barrier layer 114, and the second organic film layer 113. In exemplary embodiments, the first contact hole 212, the second contact hole 232, the third contact hole 222, and the fourth contact hole 242 may be formed at the same time. For example, after patterned photoresists (such as photoresists having different heights) are formed on the insulating interlayer 190, an etching process is performed so that the first contact hole 212, the second contact hole 232, the third contact hole 222, and the fourth contact hole 242 may be formed in the same process. In some embodiments, after the insulating interlayer 190 and the gate insulating layer 150 are removed from the third and fourth portions of the sacrificial metal pattern 401 in the process of forming the first contact hole 212 and the second contact hole 232, an additional etching process is performed, so that the second barrier layer 114 and the second organic film layer 113 may be removed from the third and fourth portions of the sacrificial metal pattern 401, and the third contact hole 222 and the fourth contact hole 242 may be formed at the same time.

As the first contact hole 212, the second contact hole 232, the third contact hole 222, and the fourth contact hole 242 are formed, the first insulating layer pattern 410, the second insulating layer pattern 420, the third insulating layer pattern 430, and the fourth insulating layer pattern 440 may be defined on the preliminary sacrificial metal pattern 401. Herein, when the first sacrificial metal pattern 401, the first insulating layer pattern 410, the second insulating layer pattern 420, the third insulating layer pattern 430, and the fourth insulating layer pattern 440 are excluded, a space formed through the third contact hole 222 and the fourth contact hole 242 in the second organic film layer 113 is defined as the first opening 701, a space formed through the third contact hole 222 and the fourth contact hole 242 in the second barrier layer 114 is defined as the second opening 702, a space formed through the third contact hole 222 and the fourth contact hole 242 in the gate insulating layer 150 is defined as the third opening 703, and a space formed through the third contact hole 222 and the fourth contact hole 242 in the insulating interlayer 190 is defined as the fourth opening 704.

Figure 10:
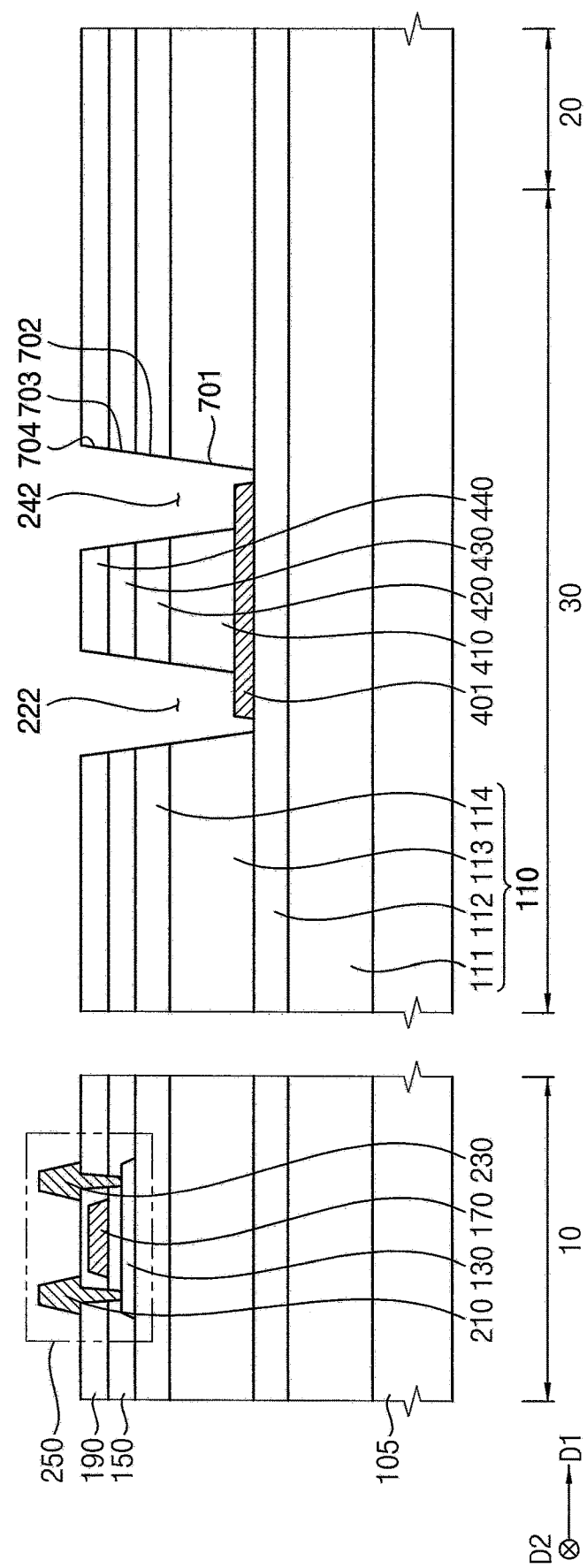

Referring to FIG. 10, a source electrode 210 may be formed to be connected to the source region of the active layer 130 through the first contact hole 212, and a drain electrode 230 may be formed to be connected to the drain region of the active layer 130 through the second contact hole 232. The source electrode 210 and the drain electrode 230 each may be formed by using a metal, an alloy, a metal nitride, a conductive metal oxide, a transparent conductive material, or the like. These may be used alone or in combination with each other. In other exemplary embodiments, the source electrode 210 and the drain electrode 230 may each have a multi-layer structure including a plurality of layers.

Accordingly, a semiconductor element 250 may be formed including the active layer 130, the gate insulating layer 150, the gate electrode 170, the insulating interlayer 190, the source electrode 210, and the drain electrode 230.

A planarization layer 270 may be formed on the insulating interlayer 190, the source electrode 210, and the drain electrode 230. The planarization layer 270 may cover the source electrode 210 and the drain electrode 230 in the display region 10 on the insulating interlayer 190, and may not be formed in the peripheral region 30. In other words, the planarization layer 270 may be formed only in the display region 10 on the insulating interlayer 190. For example, the planarization layer 270 may have a relatively high thickness in the display region 10. In such an embodiment, the planarization layer 270 may have a substantially planarized upper surface, and a planarization process may be performed with respect to the planarization layer 270 to achieve the above planarized upper surface of the planarization layer 270. Alternatively, the planarization layer 270 may be formed to have a uniform thickness along profiles of the source electrode 210 and the drain electrode 230 in the display region 10 on the insulating interlayer 190. The planarization layer 270 may be formed by using an organic material such as photoresist, polyacryl-based resin, polyimide-based resin, polyamide-based resin, siloxane-based resin, acryl-based resin, and epoxy-based resin.

A lower electrode 290 may be formed in the display region 10 on the planarization layer 270. The lower electrode 290 may be connected to the drain electrode 230 through a contact hole formed by removing a part of the planarization layer 270, and the lower electrode 290 may be electrically connected to the semiconductor element 250. The lower electrode 290 may be formed by using a metal, an alloy, a metal nitride, a conductive metal oxide, a transparent conductive material, or the like. These may be used alone or in combination with each other. In exemplary embodiments, the lower electrode 290 may have a multi-layer structure including a plurality of layers. For example, the lower electrode 290 may have a multi-layer structure in which indium tin oxide, silver, and indium tin oxide are sequentially stacked.

For example, in the process of forming the lower electrode 290, a preliminary electrode layer may be formed entirely on the substrate 110, and then the preliminary electrode layer may be etched so that the lower electrode 290 may be formed. The above etching process may proceed using a wet etching process, in which an etchant used in the wet etching process may be a mixed solution including phosphoric acid, acetic acid, nitric acid, or the like. In exemplary embodiments, the etchant may be composed of phosphoric acetic nitric acid. The etchant may etch the preliminary electrode layer and simultaneously etch a part of the preliminary sacrificial metal pattern 401 (such as both side portions of the preliminary sacrificial metal pattern 401). In other words, the etchant may simultaneously etch the preliminary electrode layer and the preliminary sacrificial metal pattern 401, so that the lower electrode 290 and the sacrificial metal pattern 405 may be formed simultaneously. Herein, the first opening 701 and the second opening 702 together define the groove 930 in the substrate 110.

As the wet etching process is performed, the sacrificial metal pattern 405 having the first width W1 smaller than the width of the preliminary sacrificial metal pattern 401 may be formed, and the sacrificial metal pattern 405 is formed under the first insulating layer pattern 410 having the second width W2 greater than the first width W1, so that an undercut shape may be generated (e.g., the sacrificial metal pattern 405 having the first width W1 smaller than the second width W2 of the first insulating layer pattern 410 is formed under the first insulating layer pattern 410).

Accordingly, an undercut structure 400 may be formed which includes the sacrificial metal pattern 405, the first insulating layer pattern 410, the second insulating layer pattern 420, the third insulating layer pattern 430 and the fourth insulating layer pattern 440.

A groove 930 (such as the first opening 701 and the second opening 702), the third opening 703, the fourth opening 704, and the undercut structure 400 may function as a shielding pattern to shield moisture and/or humidity from permeating or penetrating into the display region 10 from the opening region 20.

Figure 12:
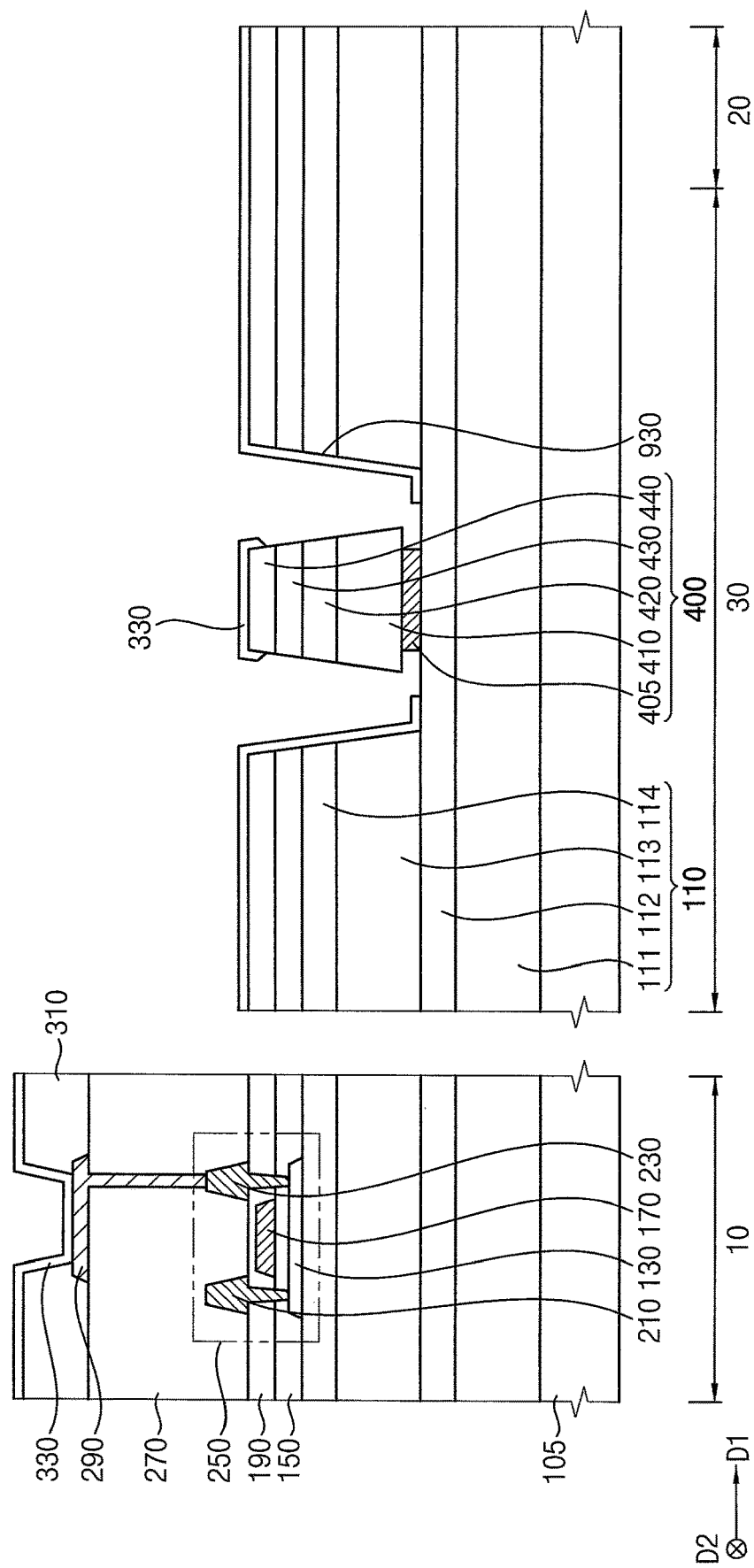

With reference to FIG. 12, the pixel defining layer 310 may be formed in the display region 10 on the planarization layer 270, and may not be formed in the peripheral region 30. In other words, the pixel defining layer 310 may be formed only in the display region 10 on the planarization layer 270. For example, the pixel defining layer 310 may expose a part of the upper surface of the lower electrode 290 while covering both side portions of the lower electrode 290. The pixel defining layer 310 may be formed by using an organic material.

A light emitting layer 330 may be formed on the pixel defining layer 310 and the lower electrode 290 in the display region 10, extend in the first direction D1, and be formed in the peripheral region 30 on the substrate 110. In exemplary embodiments, the light emitting layer 330 may be partially formed inside the groove 930, and may be spaced apart from another portion of the light emitting layer 330 by the undercut structure 400 in the depth direction at a portion where the groove 930 is located (for example, from the second barrier layer 114 to the first organic film layer 111). In other words, the light emitting layer 330 may be short-circuited by the undercut structure 400 in the peripheral region 30. That is, the light emitting layer 330 may be separated or divided in the peripheral region 30 by the groove 930, the third opening 703, the fourth opening 704, and the undercut structure 400.

The light emitting layer 330 may have a multilayer structure including an EML, an HIL, an HTL, an ETL, and an EIL. In exemplary embodiments, the EML, the HIL, the HTL, the ETL and the EIL may be formed in the peripheral region 30. In other exemplary embodiments, the HIL, the HTL, the ETL and the EIL other than the EML may be formed in the peripheral region 30.

The EML of the light emitting layer 330 may be formed using at least one of light emitting materials capable of emitting different color lights (such as red light, green light, and blue light) according to sub-pixels. On the other hand, the EML of the light emitting layer 330 may be formed by laminating a plurality of light emitting materials capable of generating different color lights such as red light, green light, and blue light, such that white light may be emitted as a whole. In such an embodiment, a color filter may also be formed on the light emitting layer 330 disposed on the lower electrode 290. The color filter may include at least one of a red color filter, a green color filter, or a blue color filter. Alternatively, the color filter may also include a yellow color filter, a cyan color filter, or a magenta color filter. The color filter may be formed by using photosensitive resin or color photoresist.

Figure 13:
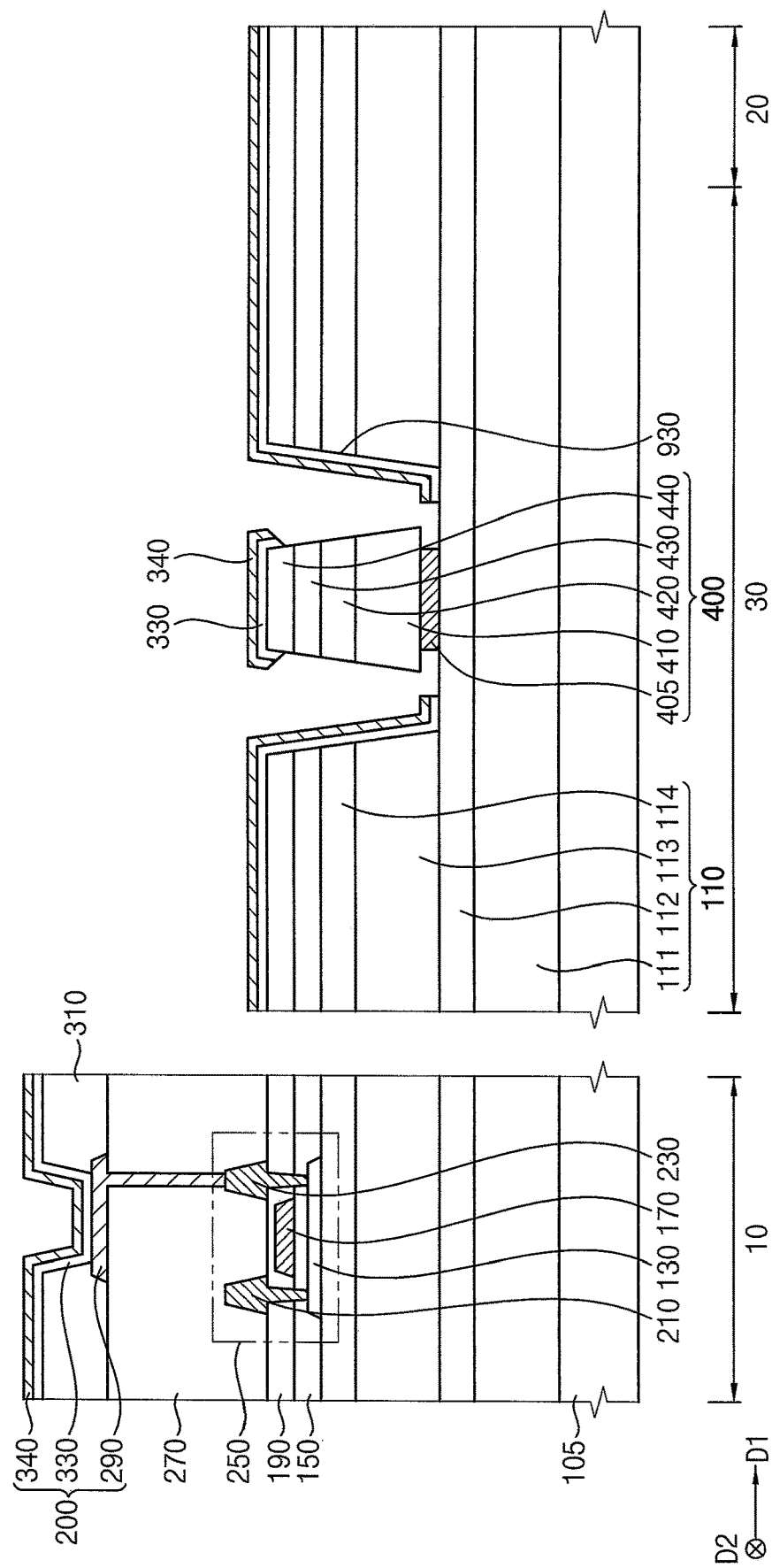

Referring to FIG. 13, an upper electrode 340 may overlap the light emitting layer 330 in the display region 10, extend in the first direction D1, and be formed in the peripheral region 30 on the light emitting layer 330. In exemplary embodiments, the upper electrode 340 may be partially formed inside the groove 930, and spaced apart from another portion of the upper electrode 340 in the depth direction at the portion where the groove 930 is located. In other words, the upper electrode 340 may be short-circuited by the undercut structure 400 in the peripheral region 30 of the upper electrode 340. That is, the upper electrode 340 may be separated or divided in peripheral region 30 by the groove 930, the third opening 703, the fourth opening 704, and the undercut structure 400. The upper electrode 340 may be formed by using a metal, an alloy, a metal nitride, a conductive metal oxide, a transparent conductive material, or the like. These may be used alone or in combination with each other. In other exemplary embodiments, the upper electrode 340 may have a multi-layer structure including a plurality of layers.

Accordingly, a light emitting structure 200 may be formed including the lower electrode 290, the light emitting layer 330, and the upper electrode 340.

A capping layer (not shown) may be formed on the upper electrode 340. The capping layer may overlap the upper electrode 340 in the display region 10, extend in the first direction D1, and be formed in the peripheral region 30 on the upper electrode 340. In exemplary embodiments, the capping layer may be partially formed inside the groove 930, and spaced apart from another portion of the capping layer in the depth direction at the portion where the groove 930 is located. In other words, the capping layer may be short-circuited by the undercut structure 400 in the peripheral region 30. That is, the capping layer may be separated or divided in the peripheral region 30 by the groove 930, the third opening 703, the fourth opening 704, and the undercut structure 400. The capping layer may protect the light emitting structure 200, and may be formed by using an organic material such as a triamine derivative, an arylene-diamine derivative, 4,4'-N,N'-dicarbazole-biphenyl, and tris-8-hydroxyquinoline aluminum.

Figure 14:
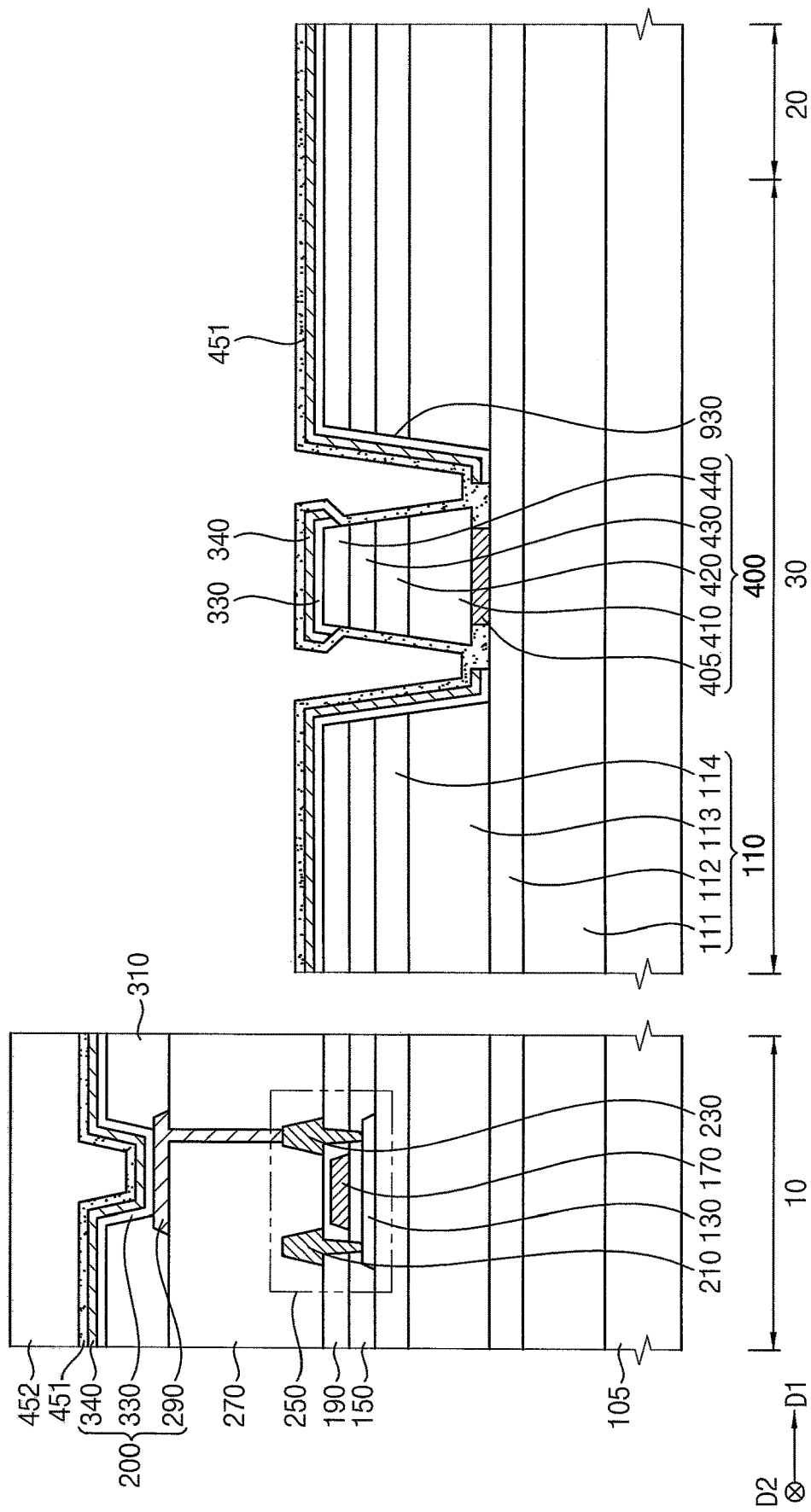

Referring to FIG. 14, a first thin film encapsulation layer 451 may be formed in the display region 10 and the peripheral region 30 on the upper electrode 340. The first thin film encapsulation layer 451 may cover the upper electrode 340 in the display region 10, be formed to have a uniform thickness along the profile of the upper electrode 340, and extend to the peripheral region 30. The first thin film encapsulation layer 451 may be formed along the profile of the upper electrode 340 in the peripheral region 30. In other words, the first thin film encapsulation layer 451 may be continuously formed along the portion of the peripheral region 30 where the groove 930 is formed. In exemplary embodiments, the first thin film encapsulation layer 451 may completely cover the groove 930 and the undercut structure 400. In other words, the first thin film encapsulation layer 451 may be in direct contact with both side portions of the sacrificial metal pattern 405. The first thin film encapsulation layer 451 may prevent the light emitting structure 200 from deteriorating due to the permeation of the moisture, oxygen, or the like. In addition, the first thin film encapsulation layer 451 may also function to protect the light emitting structure 200 from an external impact. The first thin film encapsulation layer 451 may be formed by using flexible inorganic materials.

A second thin film encapsulation layer 452 may be formed in the display region 10 on the first thin film encapsulation layer 451, and the second thin film encapsulation layer 452 may not be formed in the peripheral region 30. In other words, the second thin film encapsulation layer 452 may be formed only in the display region 10. Alternatively, the second thin film encapsulation layer 452 may be formed in a part of the peripheral region 30. The second thin film encapsulation layer 452 may improve the flatness of the OLED device 100 and protect the light emitting structure 200. The second thin film encapsulation layer 452 may be formed by using flexible organic materials.

Figure 15:
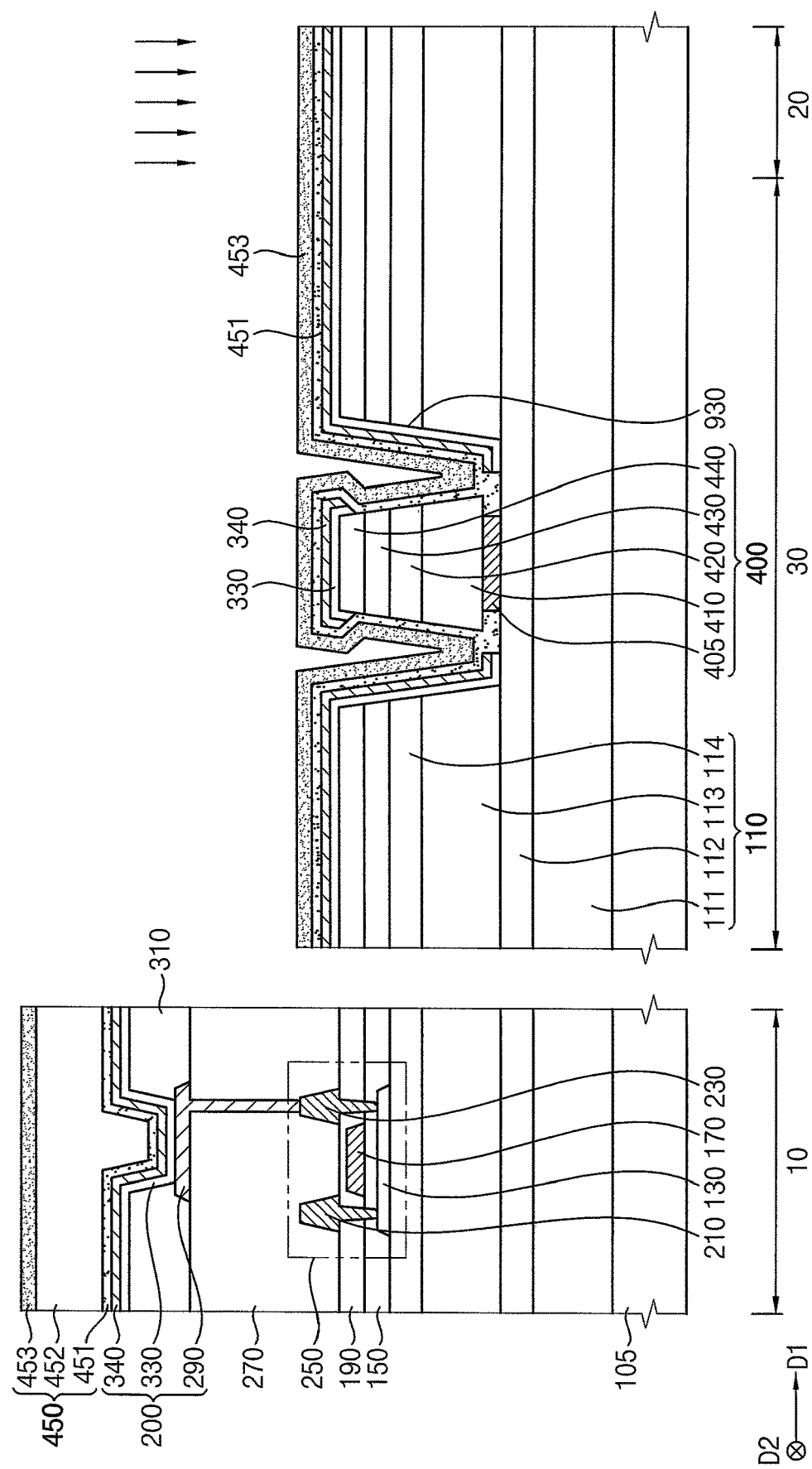

Referring to FIG. 15, a third thin film encapsulation layer 453 may be formed in the display region 10 on the second thin film encapsulation layer 452 and the peripheral region 30 on the first thin film encapsulation layer 451. The third thin film encapsulation layer 451 may cover the second thin film encapsulation layer 451 in the display region 10, be formed to have a uniform thickness along the profile of the second thin film encapsulation layer 452, and extend to the peripheral region 30. In the peripheral region 30, the third thin film encapsulation layer 453 may be formed to have a uniform thickness along the profile of the first thin film encapsulation layer 451. In other words, the third thin film encapsulation layer 453 may be continuously formed along the portion of the peripheral region 30 where the groove 930 is formed. The third thin film encapsulation layer 453 may prevent the light emitting structure 200 from deteriorating due to the permeation of the moisture, oxygen, or the like, together with the first thin film encapsulation layer 451. In addition, together with the first thin film encapsulation layer 451 and the second thin film encapsulation layer 452, the third thin film encapsulation layer 453 may also function to protect the light emitting structure 200 from the external impact. The third thin film encapsulation layer 453 may be formed by using flexible inorganic materials.

Accordingly, a thin film encapsulation structure 450 may be formed including the first thin film encapsulation layer 451, the second thin film encapsulation layer 452, and the third thin film encapsulation layer 453. Alternatively, the thin film encapsulation structure 450 may be formed in a five-layer structure laminated with first to fifth thin film encapsulation layers, or a seven-layer structure laminated with first to seventh thin film encapsulation layers.

After the thin film encapsulation structure 450 is formed, a laser may be utilized to irradiate the opening region 20 on the third thin film encapsulation layer 453. Alternatively, another etching process may be performed to expose the opening region 20 on the third thin film encapsulation layer 453.

Figure 16:
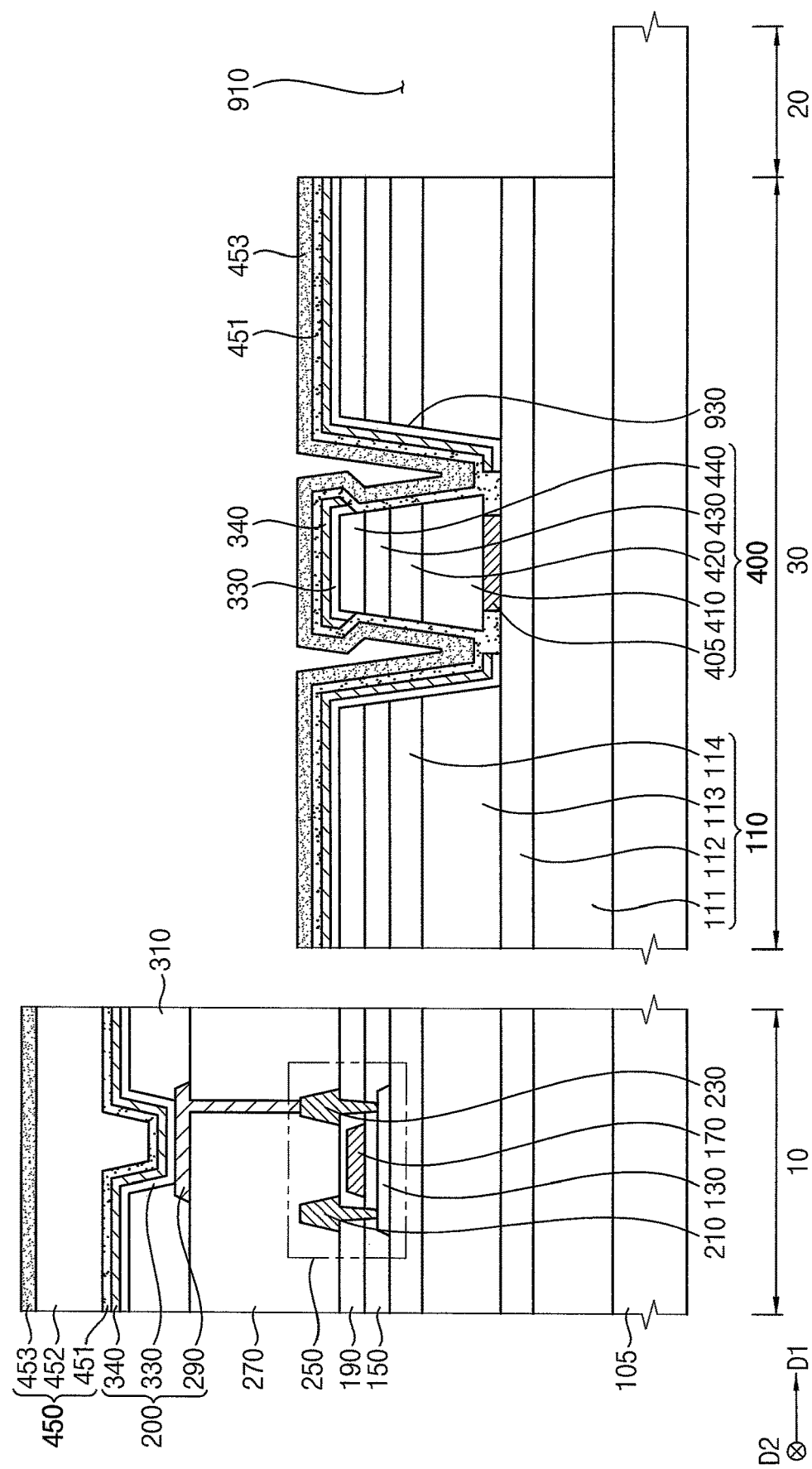
Figure 17:
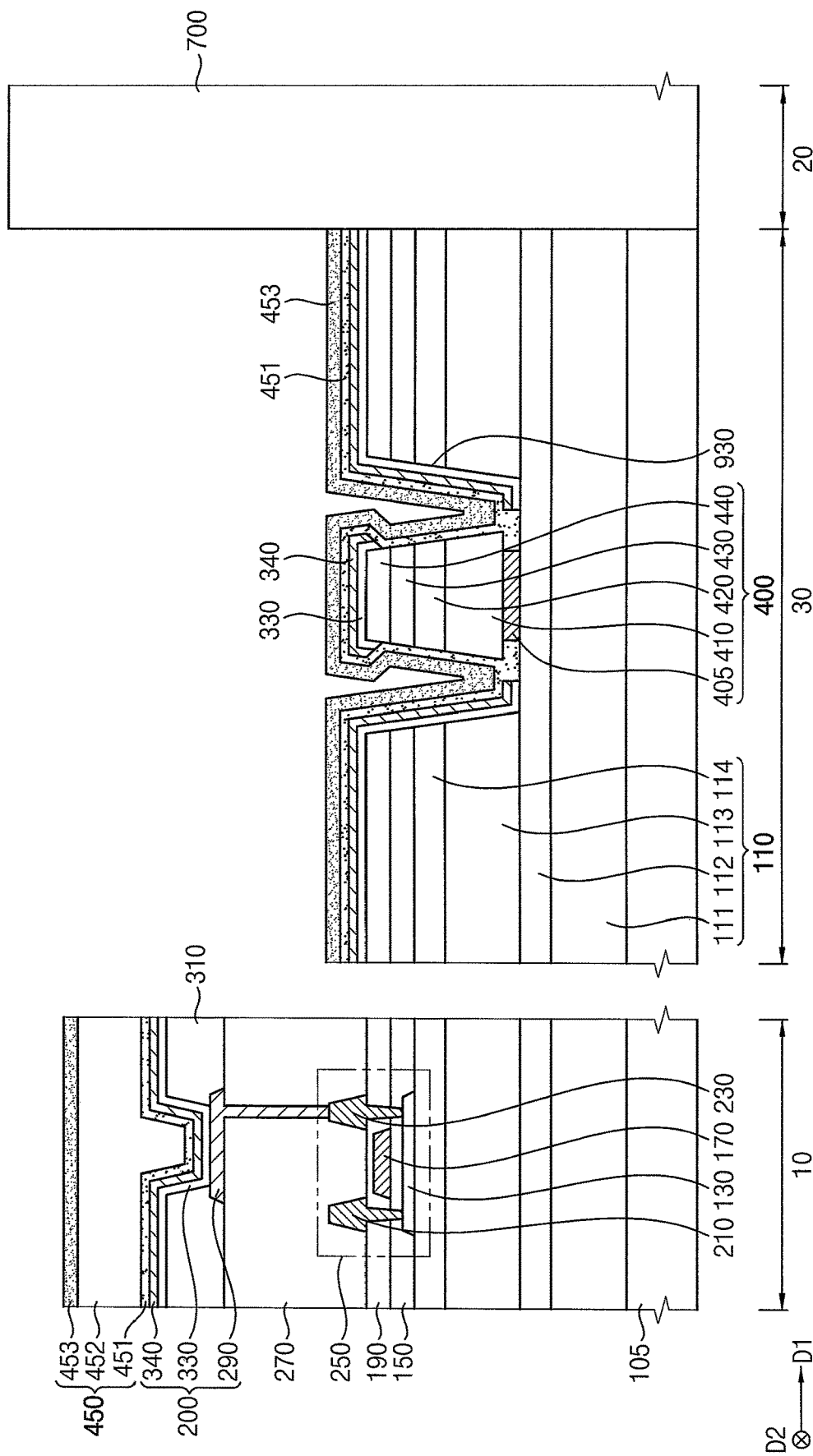

Referring to FIGS. 16, 17 and 6, an opening 910 may be formed in the opening region 20 by the laser irradiation, and the functional module 700 may be formed in the opening 910. In exemplary embodiments, the functional module 700 may be in contact with a side surface of the substrate 110, a side surface of the light emitting layer 330, a side surface of the upper electrode 340, a side surface of the first thin film encapsulation layer 451, and a side surface of the third thin encapsulation layer 453 at a boundary between the peripheral region 30 and the opening region 20. For example, the functional module 700 may include a camera module, a face recognition sensor module, a pupil recognition sensor module, an acceleration sensor module and a geomagnetism sensor module, a proximity sensor module and an infrared sensor module, an illuminance sensor module, a vibration module, and/or a speaker module. After the functional module 700 is positioned in the opening 910, the glass substrate 105 may be separated from the substrate 110. In this manner, an OLED device 100 shown in FIG. 6 can be manufactured.

Figure 18:
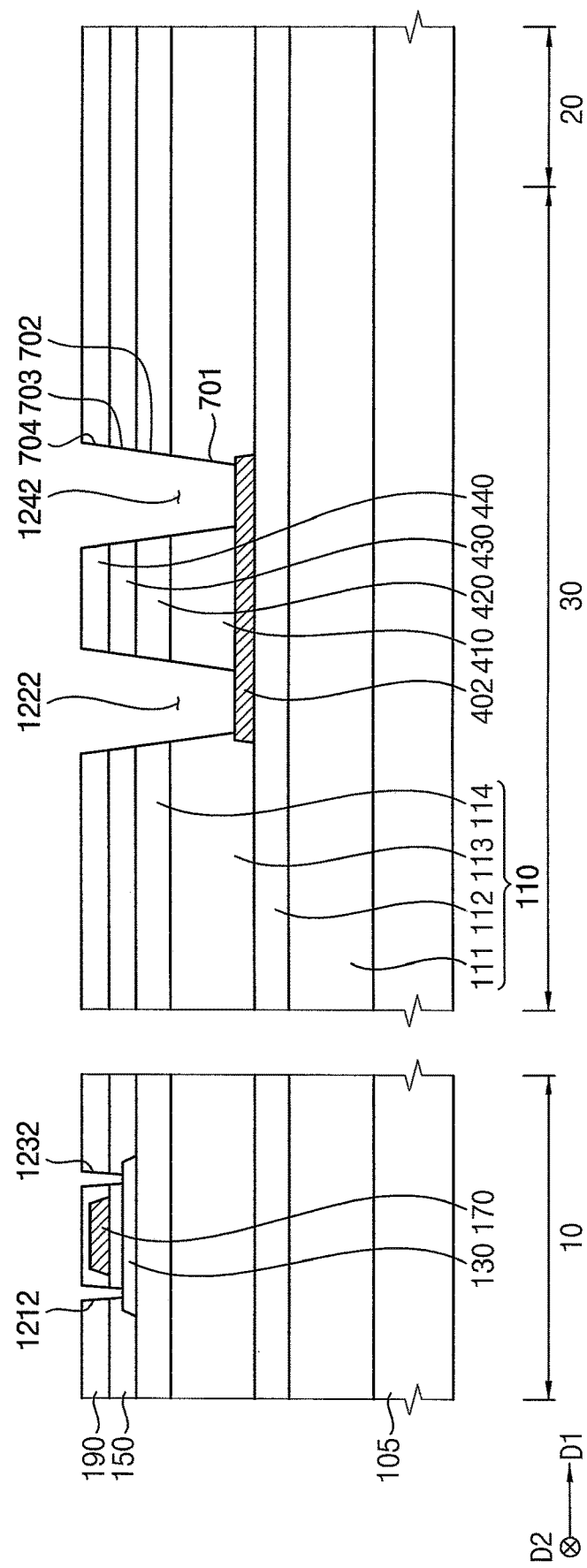
FIGS. 18 and 19 are sectional views describing a method of manufacturing an OLED device according to exemplary embodiments of the present invention.
Figure 19:
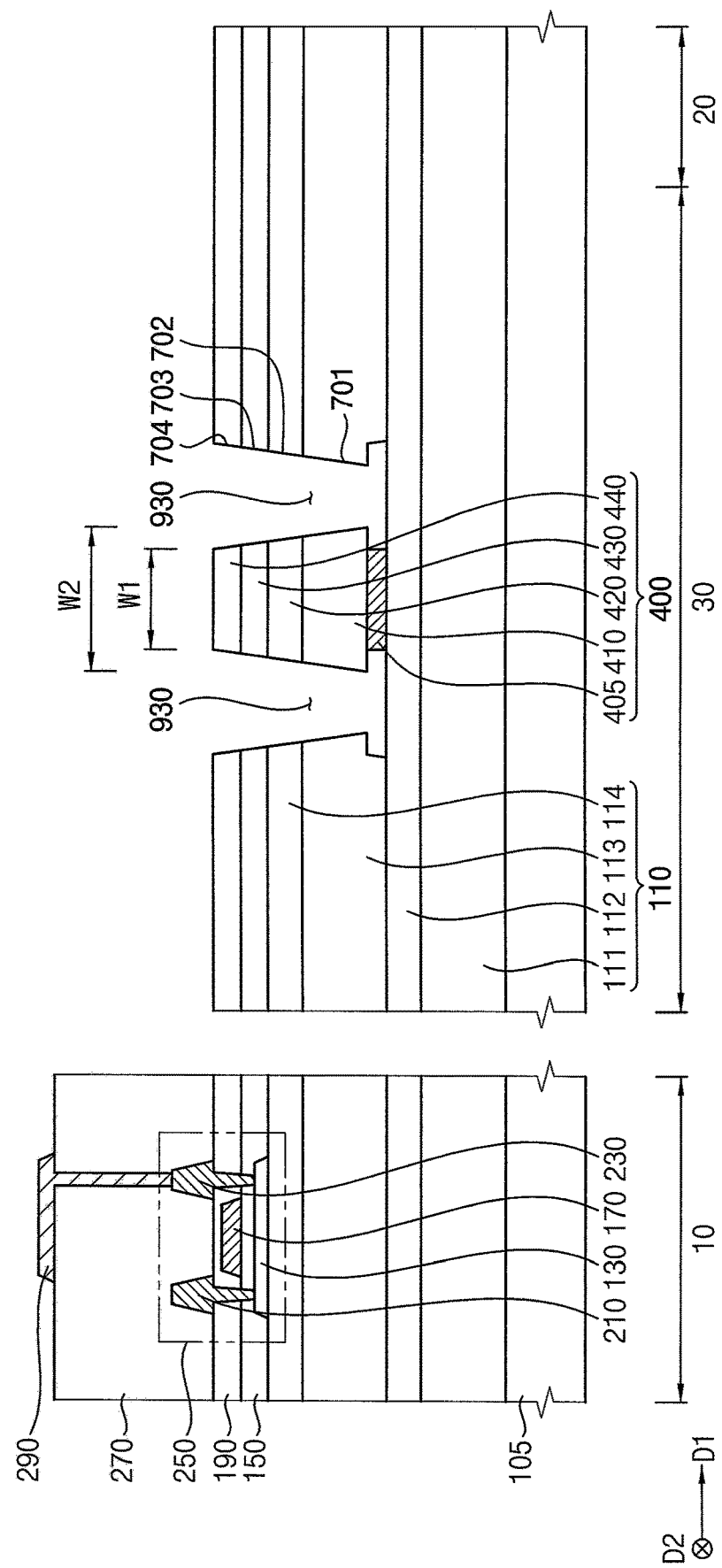

FIGS. 18 and 19 are sectional views depicting a method of manufacturing an OLED device according to exemplary embodiments of the present disclosure.

Referring to FIGS. 7, 8 and 18, after the insulating interlayer 190 is formed entirely on the gate insulating layer 150, a first contact hole 1212, a second contact hole 1232, a third contact hole 1222, and a fourth contact hole 1242 may be formed in the display region 10 and the peripheral region 30. For example, the first contact hole 1212 and the second contact hole 1232 formed in the display region 10 shown in FIG. 18 may be substantially the same as the first contact hole 212 and the second contact hole 232, respectively, shown in FIG. 9. Whereas, when compared with the third contact hole 222 and the fourth contact hole 242 shown in FIG. 9, widths of the third contact holes 1222 and the fourth contact hole 1242 in FIG. 18 may be relatively smaller, respectively. In other words, whereas both side portions of the preliminary sacrificial metal pattern 401 in FIG. 9 are exposed, both side portions of the preliminary sacrificial metal pattern 402 in FIG. 18 may be covered by the second barrier layer 114.

Referring to FIG. 19, in the process of forming the lower electrode 290, a preliminary electrode layer may be formed entirely on the substrate 110, and then the lower electrode 290 may be formed by etching the preliminary electrode layer. The above etching process may proceed using a wet etching process in which an etchant used in the wet etching process may be a mixed solution including phosphoric acid, acetic acid, nitric acid, or the like. In exemplary embodiments, the etchant may be composed of phosphoric acetic nitric acid. The etchant may etch the preliminary electrode layer and simultaneously etch a part of the preliminary sacrificial metal pattern 402 (such as both side portions of the preliminary sacrificial metal pattern 402). In other words, the etchant may simultaneously etch the preliminary electrode layer and the preliminary sacrificial metal pattern 402, so that the lower electrode 290 and the sacrificial metal pattern 405 may be formed simultaneously. Herein, the first opening 701 and the second opening 702 together define the groove 930 in the substrate 110. When the part of the preliminary sacrificial metal pattern 402 overlaps a part of the second barrier layer 114, the second barrier layer 114 may have a shape in which a lower portion thereof is expanded laterally outward. In other words, the groove 930 may have an undercut shape in which a lower portion thereof is expanded laterally outward.

Figure 20:
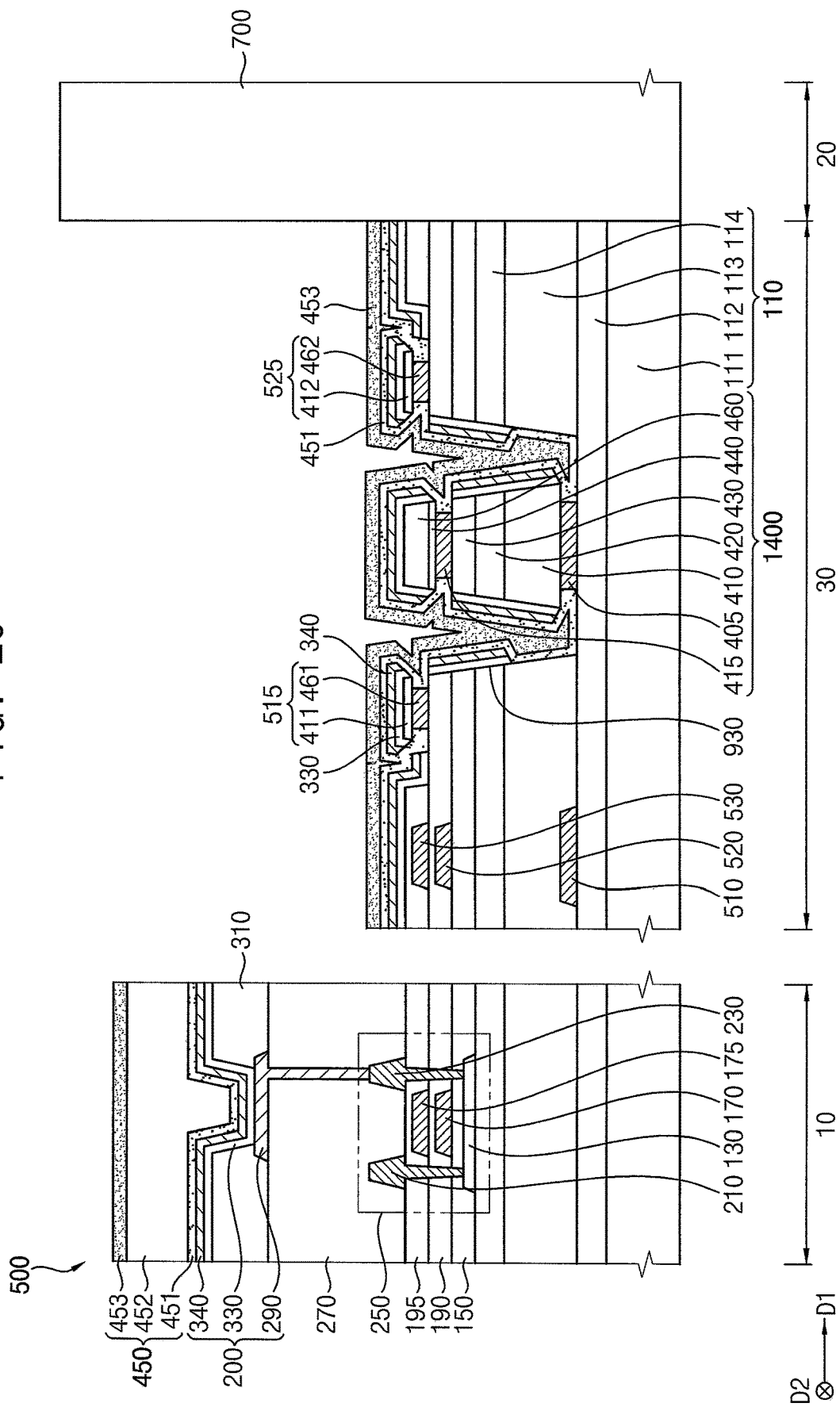
FIG. 20 is a sectional view showing an OLED device according to exemplary embodiments of the present invention.

FIG. 20 is a sectional view showing an OLED device according to exemplary embodiments of the present invention. The OLED device 500 illustrated in FIG. 20, except for an undercut structure 1400, may have substantially the same or similar configuration as the OLED device 100 described with reference to FIGS. 1 to 6. As for FIG. 20, duplicate descriptions for components substantially the same as or similar to the components described with reference to FIGS. 1 to 6 will be omitted.

Referring to FIG. 20, the OLED device 500 may include a substrate 110, an undercut structure 1400, a first wire 510, a second wire 520, a third wire 530, a semiconductor element 250, a first sub-undercut structure 515, a second sub-undercut structure 525, a planarization layer 270, a light emitting structure 200, a pixel defining layer 310, a thin film encapsulation structure 450, a functional module 700, and the like. Herein, the substrate 110 may include a first organic film layer 111, a first barrier layer 112, a second organic film layer 113 and a second barrier layer 114. In addition, the undercut structure 1400 may include a first sacrificial metal pattern 405, a first insulating layer pattern 410, a second insulating layer pattern 420, a third insulating layer pattern 430, a second sacrificial metal pattern 415, a fourth insulating layer pattern 440, and a fifth insulating layer pattern 460, the first sub-undercut structure 515 may include a first sub-sacrificial metal pattern 461 and a first sub-insulating layer pattern 411, and the second sub-undercut structure 525 may include a second sub-sacrificial metal pattern 462 and a second sub-insulating layer pattern 412. The semiconductor element 250 may include an active layer 130, a gate insulating layer 150, a first gate electrode 170, a second gate electrode 175, a first insulating interlayer 190, a second insulating interlayer 195, a source electrode 210, and a drain electrode 230. Further, the light emitting structure 200 may include a lower electrode 290, a light emitting layer 330, and an upper electrode 340, and the thin film encapsulation structure 450 may include a first thin encapsulation layer 451, a second thin encapsulation layer 452, and a third thin encapsulation layer 453.

In exemplary embodiments, the substrate 110 may further include a groove 930 formed in the peripheral region 30, and the undercut structure 1400 may be disposed inside the groove 930 and spaced apart from an inner wall of the groove 930. In addition, the light emitting layer 330 and the upper electrode 340 may be spaced apart, inside the groove 930, by the undercut structure 1400. In other words, each of the light emitting layer 330 and the upper electrode 340 may be short-circuited by the undercut structure 1400 inside the groove 930. In addition, the first sub-undercut structure 515 and the second sub-undercut structure 525 are disposed outside the groove 930 (for example, on the upper surface of the first insulating interlayer 190), so that each of the light emitting layer 330 and the upper electrode 340 may be short-circuited. Accordingly, the OLED device 500 includes the light emitting layer 330 and the upper electrode 340 short-circuited by the undercut structure 1400 and the first and second sub-undercut structures 515 and 525 inside and outside the groove 930, so that the moisture, humidity and the like may be prevented from permeating into the semiconductor element 250 and the light emitting structure 200.

Further, the substrate 110 may further include the opening 910 formed in the opening region 20, and the functional module 700 may be disposed in the opening 910.

The first gate electrode 170 may be disposed in the display region 10 on the gate insulating layer 150. The first gate electrode 170 may be disposed on a portion of the gate insulating layer 150 which the active layer 130 is located below. The first gate electrode 170 may include a metal, an alloy, a metal nitride, a conductive metal oxide, a transparent conductive material, or the like. These may be used alone or in combination with each other. For example, the first gate electrode 170 may be composed of molybdenum. Alternatively, the first gate electrode 170 may include a multi-layer structure including a plurality of layers.

The first insulating interlayer 190 may be disposed on the first gate electrode 170. The first insulating interlayer 190 may cover the first gate electrode 170 in the display region 10 on the substrate 110, extend in the first direction D1, and be disposed in the peripheral region 30 on the substrate 110. In exemplary embodiments, the first insulating interlayer 190 may have a fourth opening 704 that overlaps the third opening 703 in the peripheral region 30. In other words, the first insulating interlayer 190 may expose the upper surface of the first barrier layer 112 located in the peripheral region 30 through the fourth opening 704. For example, the first insulating interlayer 190 may sufficiently cover the first gate electrode 170 in the display region 10 on the gate insulating layer 150, and have a substantially flat upper surface without generating a step around the first gate electrode 170. Alternatively, the first insulating interlayer 190 may cover the first gate electrode 170 in the display region 10 on the gate insulating layer 150, and be disposed to have a uniform thickness along a profile of the first gate electrode 170. The first insulating interlayer 190 may include silicon compound, metal oxide, or the like. Alternatively, the insulating interlayer 190 may have a multi-layer structure including a plurality of insulating layers. For example, the insulating layers may have different thicknesses or include different materials.

The second gate electrode 175 may be disposed in the display region 10 on the first gate insulating layer 190. The second gate electrode 175 may be disposed on a portion of the first gate insulating layer 190 which the first gate electrode 170 is located below. The second gate electrode 175 may include a metal, an alloy, a metal nitride, a conductive metal oxide, a transparent conductive material, or the like. These may be used alone or in combination with each other. For example, the second gate electrode 175 may be composed of molybdenum. Alternatively, the second gate electrode 175 may include a multi-layer structure including a plurality of layers.

The second insulating interlayer 195 may be disposed on the second gate electrode 175. The second insulating interlayer 195 may cover the second gate electrode 175 in the display region 10 on the substrate 110, extend in the first direction D1, and be disposed in the peripheral region 30 on the substrate 110. In exemplary embodiments, the second insulating interlayer 195 may have a fifth opening that overlaps the fourth opening 704 in the peripheral region 30. In exemplary embodiments, the width of the fifth opening may be greater than the width of the fourth opening 704, and a part of an upper surface of the first insulating interlayer 190 and a part of the upper surface of the first barrier layer 112 located in the peripheral region 30 may be exposed through the fifth opening. For example, the second insulating interlayer 195 may sufficiently cover the second gate electrode 175 in the display region 10 on the first insulating interlayer 190, and have a substantially flat upper surface without generating a step around the second gate electrode 175. Alternatively, the second insulating interlayer 195 may cover the second gate electrode 175 in the display region 10 on the first insulating interlayer 190, and be disposed to have a uniform thickness along a profile of the second gate electrode 175. The second insulating interlayer 195 may include silicon compound, metal oxide, or the like. Alternatively, the second insulating interlayer 195 may have a multi-layer structure including a plurality of insulating layers. For example, the insulating layers may have different thicknesses or include different materials.

The source electrode 210 and the drain electrode 230 may be disposed in the display region 10 on the second insulating interlayer 195. The source electrode 210 may be connected to the source region of the active layer 130 through a contact hole formed by removing first portions of the gate insulating layer 150, the first insulating interlayer 190, and the second insulating interlayer 195, and the drain electrode 230 may be connected to the drain region of the active layer 130 through a contact hole formed by removing second portions of the gate insulating layer 150, the first insulating interlayer 190, and the second insulating interlayer 195. The source electrode 210 and the drain electrode 230 may each include a metal, an alloy, a metal nitride, a conductive metal oxide, a transparent conductive material, or the like. These may be used alone or in combination with each other. In other exemplary embodiments, the source electrode 210 and the drain electrode 230 may each have a multi-layer structure including a plurality of layers.

Accordingly, the semiconductor element 250 including the active layer 130, the gate insulating layer 150, the first gate electrode 170, the first insulating interlayer 190, the second gate electrode 175, the second insulating interlayer 195, the source electrode 210, and the drain electrode 230 may be disposed between the substrate 110 and the light emitting structure 200.

The first sacrificial metal pattern 405 may be disposed inside the groove 930 of the substrate 110. In other words, the first sacrificial metal pattern 405 may be disposed on the upper surface of the first barrier layer 112. In exemplary embodiments, the first sacrificial metal pattern 405 may have the first width W1, and be spaced apart from the inner wall of the groove 930. In addition, the sacrificial metal pattern 405 may be spaced apart from the light emitting layer 330 and the upper electrode 340 disposed in the groove 930 (or the peripheral region 30). In other words, the first sacrificial metal pattern 405 might not be in direct contact with the light emitting layer 330 and the upper electrode 340. The first sacrificial metal pattern 405 may include a metal, an alloy, a metal nitride, a conductive metal oxide, a transparent conductive material, or the like. These may be used alone or in combination with each other. In exemplary embodiments, the first sacrificial metal pattern 405 may include a material etched by an etchant used to pattern the lower electrode 290. For example, the first sacrificial metal pattern 405 may be composed of molybdenum. In other exemplary embodiments, the first sacrificial metal pattern 405 may have a multi-layer structure including a plurality of layers.

The first insulating layer pattern 410 may be disposed on the first sacrificial metal pattern 405. The first insulating layer pattern 410 may be disposed inside the groove 930. In exemplary embodiments, the first insulating layer pattern 410 may have a second width W2 greater than the first width W1, and be spaced apart from the inner wall of the groove 930. In addition, the first insulating layer pattern 410 may be located on the same layer as the second organic film layer 113. The first insulating layer pattern 410 may include a flexible organic material. For example, the first insulating layer pattern 410 may include a random copolymer or a block copolymer. In exemplary embodiments, the first insulating layer pattern 410 may include polyimide.

The second insulating layer pattern 420 may be disposed on the first insulating layer pattern 410. The second insulating layer pattern 420 may be disposed inside the groove 930. In exemplary embodiments, the width of the second insulation layer pattern 420 may be greater than the first width W1, and be spaced apart from the inner wall of the groove 930. In addition, the second insulating layer pattern 420 may be located on the same layer as the second barrier layer 114. Alternatively, the width of the second insulating layer pattern 420 may be equal to or smaller than the first width W1. The second insulating layer pattern 420 may include a flexible inorganic material. In exemplary embodiments, the second insulating layer pattern 420 may include silicon oxide, silicon nitride, or the like.

The third insulating layer pattern 430 may be disposed on the second insulating layer pattern 420. The third insulating layer pattern 430 may be disposed inside the third opening 703. In exemplary embodiments, the width of the third insulating layer pattern 430 may be greater than the first width W1, and be spaced apart from the inner wall of the third opening 703. In addition, the third insulating layer pattern 430 may be located on the same layer as the gate insulating layer 150. Alternatively, the width of the third insulating layer pattern 430 may be equal to or smaller than the first width W1. The third insulating layer pattern 430 may include silicon compound, metal oxide, or the like.

The second sacrificial metal pattern 415 may be disposed inside the fourth opening 704 of the first insulating interlayer 190. In other words, the second sacrificial metal pattern 415 may be disposed on an upper surface of the third insulating layer pattern 430. In exemplary embodiments, the width of the second sacrificial metal pattern 415 may be smaller than the first width W1, and be spaced apart from the inner wall of the fourth opening 704. In addition, the sacrificial metal pattern 405 may be spaced apart from the light emitting layer 330 and the upper electrode 340 disposed in the groove 930 (or the peripheral region 30). In other words, the second sacrificial metal pattern 415 might not be in direct contact with the light emitting layer 330 and the upper electrode 340. The second sacrificial metal pattern 415 may include a metal, an alloy, a metal nitride, a conductive metal oxide, a transparent conductive material, or the like. These may be used alone or in combination with each other. In exemplary embodiments, the second sacrificial metal pattern 415 may include a material etched by an etchant used to pattern the lower electrode 290, and be formed simultaneously by using the same material in the same layer as the first gate electrode 170. For example, the second sacrificial metal pattern 405 may be composed of molybdenum. In other exemplary embodiments, the second sacrificial metal pattern 415 may have a multi-layer structure including a plurality of layers.

The fourth insulating layer pattern 440 may be disposed on the second sacrificial metal pattern 415. The fourth insulating layer pattern 440 may be disposed inside the fourth opening 704. In exemplary embodiments, the width of the fourth insulating layer pattern 440 may be greater than the width of the second sacrificial metal pattern 415, and be spaced apart from the inner wall of the fourth opening 704. In addition, the fourth insulating layer pattern 440 may be located on the same layer as the first insulating interlayer 190. The fourth insulating layer pattern 440 may include silicon compound, metal oxide, or the like.

The fifth insulating layer pattern 460 may be disposed on the fourth insulating layer pattern 440. The fifth insulating layer pattern 460 may be disposed inside the fifth opening. In exemplary embodiments, the width of the fifth insulating layer pattern 460 may be greater than the width of the second sacrificial metal pattern 415, and be spaced apart from an inner wall of the fifth opening. In addition, the fifth insulating layer pattern 460 may be located on the same layer as the second insulating interlayer 195. The fifth insulating layer pattern 460 may include silicon compound, metal oxide, or the like.

Accordingly, the undercut structure 1400 including the first sacrificial metal pattern 405, the second sacrificial metal pattern 415, the first insulating layer pattern 410, the second insulating layer pattern 420, the third insulating layer pattern 430, the fourth insulating layer pattern 440, and the fifth insulating layer pattern 460 may be disposed.

The first sub-undercut structure 515 and the second sub-undercut structure 515 may be disposed on the upper surface of the first insulating interlayer 190 located in the peripheral region 30 exposed by the fifth opening of the second insulating interlayer 195. In other words, the first sub-undercut structure 515 and the second sub-undercut structure 525 may be spaced apart from both side positions of the undercut structure 1400.

For example, the first sub-undercut structure 515 may be disposed at a left side of the undercut structure 1400. The first sub-sacrificial metal pattern 461 may be disposed on the upper surface of the first insulating interlayer 190 exposed by the fifth opening. In exemplary embodiments, the width of the first sub-sacrificial metal pattern 461 may be smaller than the width of the first sub-insulating layer pattern 411. The first sub-sacrificial metal pattern 461 might not be in contact with the light emitting layer 330 and the upper electrode 340 disposed in the peripheral region 30, and both side portions of the first sub-sacrificial metal pattern 461 may be in direct contact with the first thin-film encapsulation layer 451. The first sub-sacrificial metal pattern 461 may include a metal, an alloy, a metal nitride, a conductive metal oxide, a transparent conductive material, or the like. These may be used alone or in combination with each other. In exemplary embodiments, the first sub-sacrificial metal pattern 461 may include a material etched by an etchant used to pattern the lower electrode 290. For example, the first sub-sacrificial metal pattern 461 may be formed simultaneously by using the same material in the same layer as the second gate electrode 175, and composed of molybdenum. In other exemplary embodiments, the first sub-sacrificial metal pattern 461 may have a multi-layer structure including a plurality of layers.

The first sub-insulating layer pattern 411 may be disposed on the first sub-sacrificial metal pattern 461. The first sub-insulating layer pattern 411 may be disposed inside the fifth opening. In exemplary embodiments, the width of the first sub-insulating layer pattern 411 may be greater than the width of the first sub-sacrificial metal pattern 461, and be spaced apart from an inner wall of the fifth opening.

In addition, the first sub-insulating layer pattern 411 may be located on the same layer as the second insulating interlayer 195. The first sub-insulating layer pattern 411 may include silicon compound, metal oxide, or the like. In addition, the second sub-undercut structure 525 may be disposed at a right side of the undercut structure 1400. The second sub-sacrificial metal pattern 462 may be disposed on the upper surface of the first insulating interlayer 190 exposed by the fifth opening. In exemplary embodiments, the width of the second sub-sacrificial metal pattern 462 may be smaller than the width of the second sub-insulating layer pattern 412. The second sub-sacrificial metal pattern 462 might not be in contact with the light emitting layer 330 and the upper electrode 340 disposed in the peripheral region 30, and both side portions of the second sub-sacrificial metal pattern 462 may be in direct contact with the first thin-film encapsulation layer 451. The second sub-sacrificial metal pattern 462 may include a metal, an alloy, a metal nitride, a conductive metal oxide, a transparent conductive material, or the like. These may be used alone or in combination with each other. In exemplary embodiments, the second sub-sacrificial metal pattern 462 may include a material etched by an etchant used to pattern the lower electrode 290. For example, the second sub-sacrificial metal pattern 462 may be formed simultaneously by using the same material in the same layer as the second gate electrode 175, and composed of molybdenum. In other exemplary embodiments, the second sub-sacrificial metal pattern 462 may have a multi-layer structure including a plurality of layers.

The second sub-insulating layer pattern 412 may be disposed on the second sub-sacrificial metal pattern 462. The second sub-insulating layer pattern 412 may be disposed inside the fifth opening.

In exemplary embodiments, the width of the second sub-insulating layer pattern 412 may be greater than the width of the second sub-sacrificial metal pattern 462, and be spaced apart from an inner wall of the fifth opening. In addition, the second sub-insulating layer pattern 412 may be located in the same layer as the second insulating interlayer 195. The second sub-insulating layer pattern 412 may include silicon compound, metal oxide, or the like. In exemplary embodiments, the first sub-undercut structure 515 and the second sub-undercut structure 525 may be symmetrical with respect to the undercut structure 1400.

The first wire 510 may be disposed in the peripheral region 30 on the second organic film layer 113. The first wire 510 may be spaced apart from the first sacrificial metal pattern 405, and formed simultaneously by using the same material in the same layer as the first sacrificial metal pattern 405.

The second wire 520 may be disposed in the peripheral region 30 on the gate insulating layer 150. The second wire 520 may be spaced apart from the second sacrificial metal pattern 415, and formed simultaneously by using the same material in the same layer as the first gate electrode 170 and the second sacrificial metal pattern 415.

The third wire 530 may be disposed in the peripheral region 30 on the first insulating interlayer 190. The third wire 530 may be spaced apart from the first sub-sacrificial metal pattern 461, and formed simultaneously by using the same material in the same layer as the second gate electrode 175 and the first sub-sacrificial metal pattern 461.

The first to third wires 510, 520, and 530 may include a data signal wire, a gate signal wire, a light emission control signal wire, a gate initialization signal wire, an initialization voltage wire, a power supply voltage wire, or the like and transfer the data signal, the gate signal, the light emission control signal, the gate initialization signal, an initialization voltage, and a power supply voltage to the semiconductor element 250 and/or the light emitting structure 200.

In other exemplary embodiments, the first wire 510, the second wire 520 and the third wire 530 may be disposed between the undercut structure 1400 and the functional module 700.

The OLED device 500 according to the exemplary embodiments of the present invention includes the undercut structure 1400, the first sub-undercut structure 515, and the second sub-undercut structure 525 in the peripheral region 30, such that the OLED device 500 can easily prevent moisture, humidity and the like from permeating into the semiconductor element 250 and the light emitting structure 200 from the peripheral region 30 to the display region 10.

In addition, the OLED device 500 includes the first to third wires 510, 520, and 530 disposed in the peripheral region 30, such that the number of signal and voltage wires disposed in an outer periphery (such as a non-display region) of the display region 10 can be reduced. Accordingly, the OLED device 500 can reduce the width of the outside (such as a dead space) of the display region 10.

Figure 21:
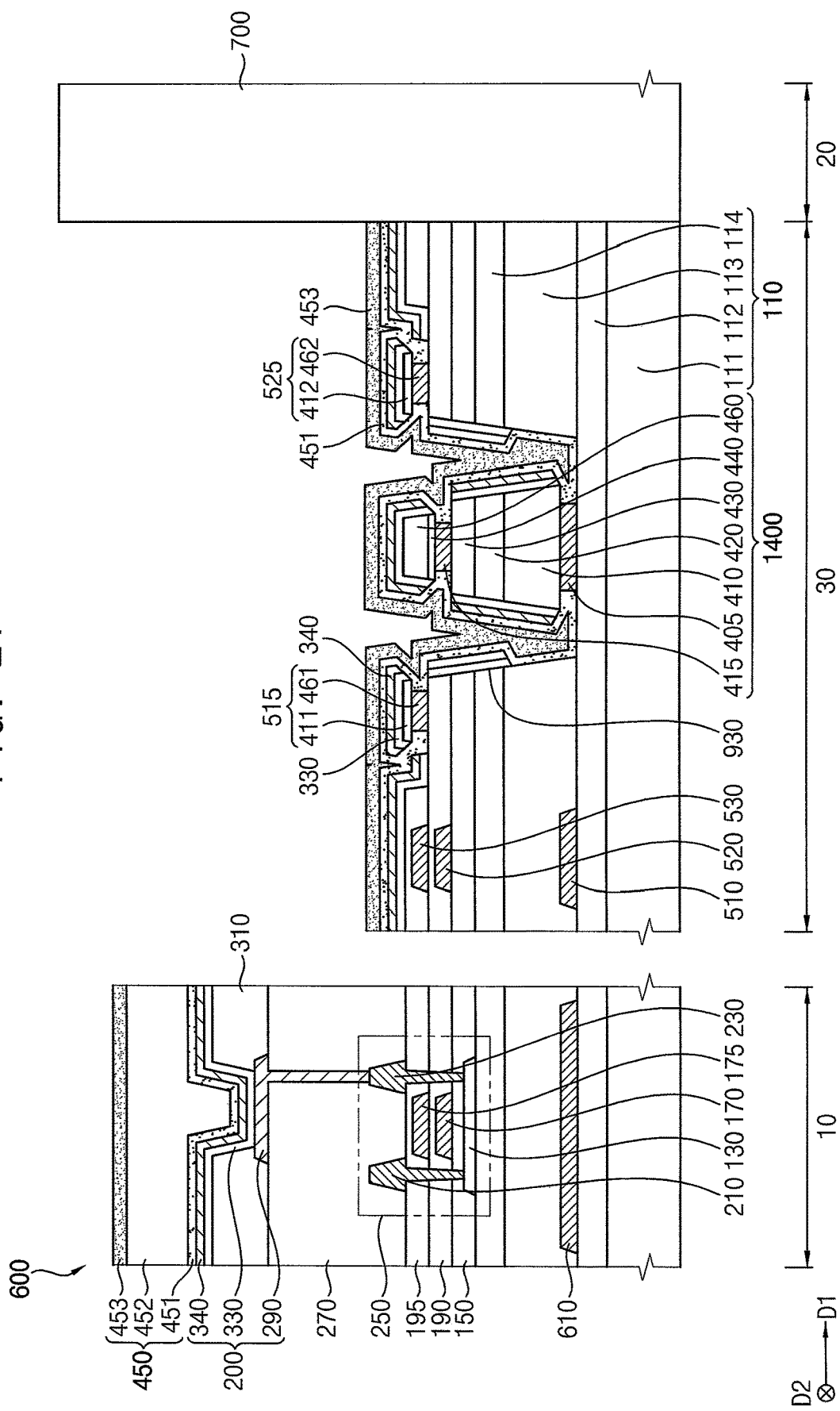
FIG. 21 is a sectional view showing an OLED device according to exemplary embodiments of the present invention.

FIG. 21 is a sectional view showing an OLED device according to exemplary embodiments of the present disclosure. The OLED device 600 illustrated in FIG. 21, except for the shape of the undercut structure 1400 and a light shielding pattern 610, may have substantially the same or similar configuration as the OLED device 500 described with reference to FIG. 20. As for FIG. 21, duplicate descriptions for components substantially the same as or similar to the components described with reference to FIG. 20 will be omitted.

With reference to FIG. 21, the OLED device 600 may include a substrate 110, an undercut structure 1400, a light shielding pattern 610, a first wire 510, a second wire 520, a third wire 530, a semiconductor element 250, a first sub-undercut structure 515, a second sub-undercut structure 525, a planarization layer 270, a light emitting structure 200, a pixel defining layer 310, a thin film encapsulation structure 450, a functional module 700, and the like. In one or more embodiments, the substrate 110 may include a first organic film layer 111, a first barrier layer 112, a second organic film layer 113 and a second barrier layer 114. In addition, the undercut structure 1400 may include a first sacrificial metal pattern 405, a first insulating layer pattern 410, a second insulating layer pattern 420, a third insulating layer pattern 430, a second sacrificial metal pattern 415, a fourth insulating layer pattern 440, and a fifth insulating layer pattern 460. The first sub-undercut structure 515 may include a first sub-sacrificial metal pattern 461 and a first sub-insulating layer pattern 411, and the second sub-undercut structure 525 may include a second sub-sacrificial metal pattern 462 and a second sub-insulating layer pattern 412.

When compared with the undercut structure 1400 in FIG. 20, the widths of the second sacrificial metal pattern 415, the fourth insulating layer pattern 440, and the fifth insulating layer pattern 460 of the undercut structure 1400 in FIG. 21 may be relatively smaller. In such an embodiment, steps of the third insulating layer pattern 430 and the fourth insulating layer pattern 440 may be relatively larger, and the light emitting layer 330 and the upper electrode 340 disposed in the peripheral region 30 may be more easily short-circuited.

The light shielding pattern 610 may be disposed in the display region 10 on the first barrier layer 112. In other words, the light shielding pattern 610 may be disposed below the active layer 130 while overlapping the semiconductor element 250.

A predetermined voltage may be applied to the light shielding pattern 610. When the voltage is applied to the shielding pattern 610, the shielding pattern 610 may relatively reduce the interference of a drive of the semiconductor element 250 due to electric charges contained in the substrate 110. Alternatively, the light shielding pattern 610 may be grounded at the outside of the OLED device 600. In such an embodiment, the electric charges contained in the substrate 110 may be released to the outside through the light shielding pattern 610. In other words, when the shielding pattern 610 is grounded, the shielding pattern 610 may relatively reduce the interference of a drive of the semiconductor element 250 due to electric charges contained in the substrate 110. In addition, the light shielding pattern 610 may correspond to a back gate of the semiconductor element 250. Further, the light shielding pattern 610 may function as a light shielding pattern to shield external light incident from the outside. The light shielding pattern 610 may include a metal, an alloy, a metal nitride, a conductive metal oxide, a transparent conductive material, or the like. These may be used alone or in combination with each other. Alternatively, the light shielding pattern 610 may include a multi-layer structure including a plurality of layers.

In exemplary embodiments, the light shielding pattern 610, the first wire 510, and the first sacrificial metal pattern 405 may be formed simultaneously by using the same material in the same layer.

Figure 22:
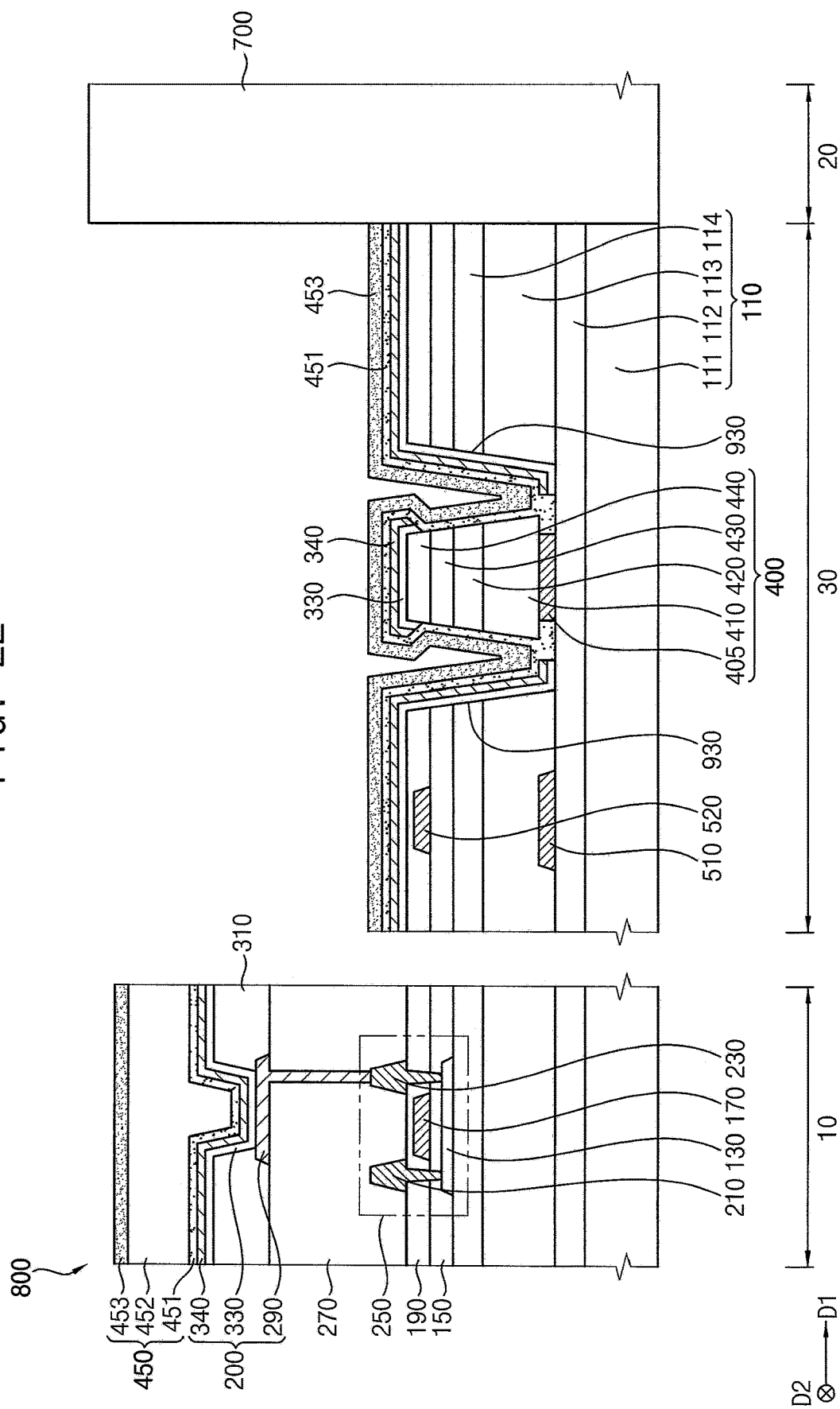
FIG. 22 is a sectional view showing an OLED device according to exemplary embodiments of the present invention.

FIG. 22 is a sectional view showing an OLED device according to exemplary embodiments of the present disclosure. The OLED device 800 illustrated in FIG. 22, except for the first wire 510 and the second wire 520, may have substantially the same or similar configuration as the OLED device 100 described with reference to FIGS. 1 to 6. As for FIG. 22, duplicate descriptions for components substantially the same as or similar to the components described with reference to FIGS. 1 to 6 will be omitted.

With reference to FIG. 22, the OLED device 800 may include a substrate 110, an undercut structure 400, a first wire 510, a second wire 520, a semiconductor element 250, a planarization layer 270, a light emitting structure 200, a pixel defining layer 310, a thin film encapsulation structure 450, a functional module 700, and the like. Herein, the substrate 110 may include a first organic film layer 111, a first barrier layer 112, a second organic film layer 113 and a second barrier layer 114. In addition, the undercut structure 400 may include a sacrificial metal pattern 405, a first insulating layer pattern 410, a second insulating layer pattern 420, a third insulating layer pattern 430, and a fourth insulating layer pattern 440.

The first wire 510 may be disposed in the peripheral region 30 on the second organic film layer 113. The first wire 510 may be spaced apart from the sacrificial metal pattern 405, and may formed simultaneously by using the same material in the same layer as the sacrificial metal pattern 405.

The second wire 520 may be disposed in the peripheral region 30 on the gate insulating layer 150. The second wire 520 may be formed simultaneously by using the same material in the same layer as the first gate electrode 170.

The first and second wires 510 and 520 may include a data signal wire, a gate signal wire, a light emission control signal wire, a gate initialization signal wire, an initialization voltage wire, a power supply voltage wire, or the like, and the first and second wires 510 and 520 may transfer the data signal, the gate signal, the light emission control signal, the gate initialization signal, an initialization voltage, and a power supply voltage to the semiconductor element 250 and/or the light emitting structure 200.

The OLED device 800 according to the exemplary embodiments of the present disclosure includes the first and second wires 510 and 520 disposed in the peripheral region 30, such that the number of signal and voltage wires disposed in an outer periphery (such as a non-display region) of the display region 10 can be reduced. Accordingly, the OLED device 800 can reduce the dead space.

Figure 23:
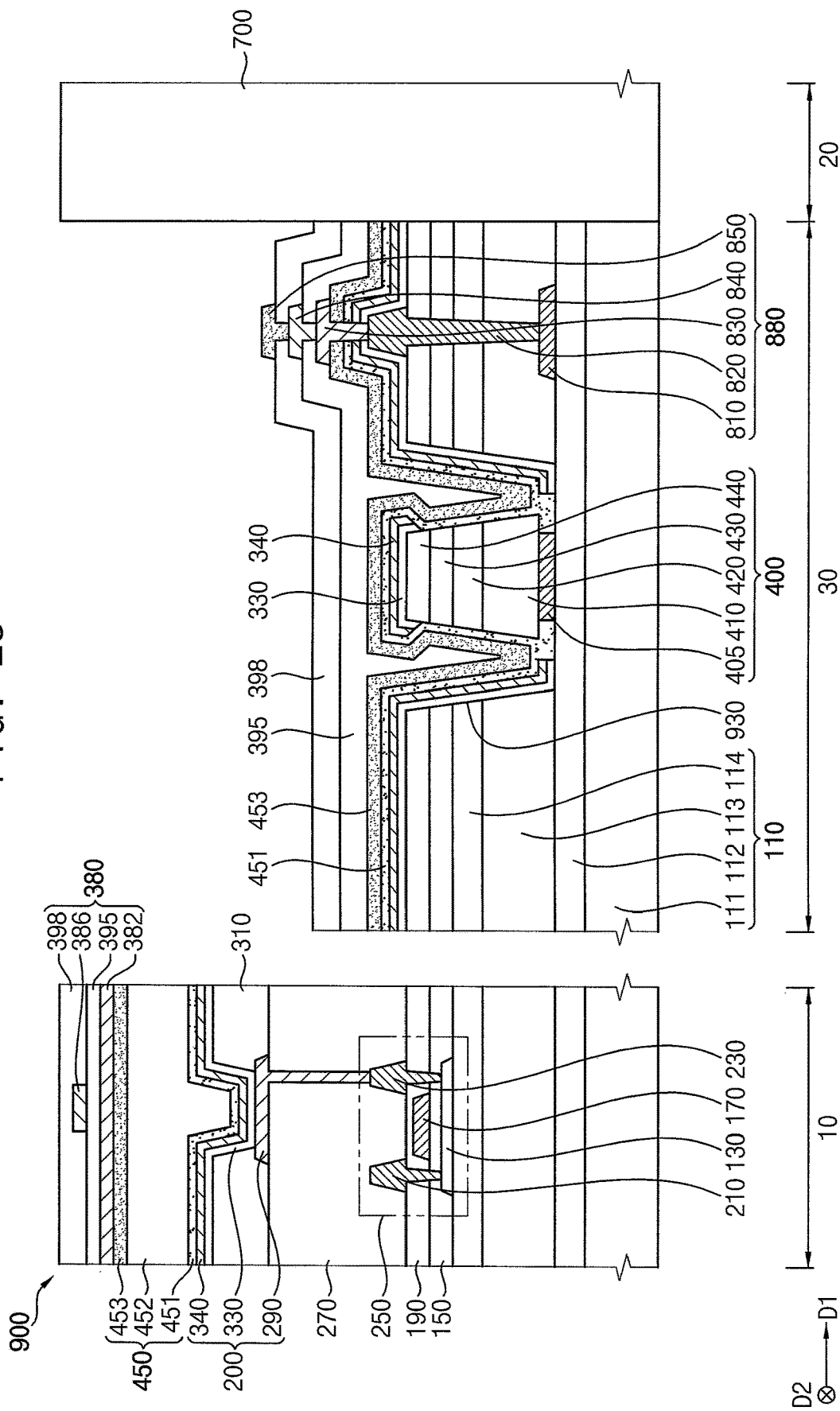
FIG. 23 is a sectional view showing an OLED device according to exemplary embodiments of the present invention.
Figure 24:
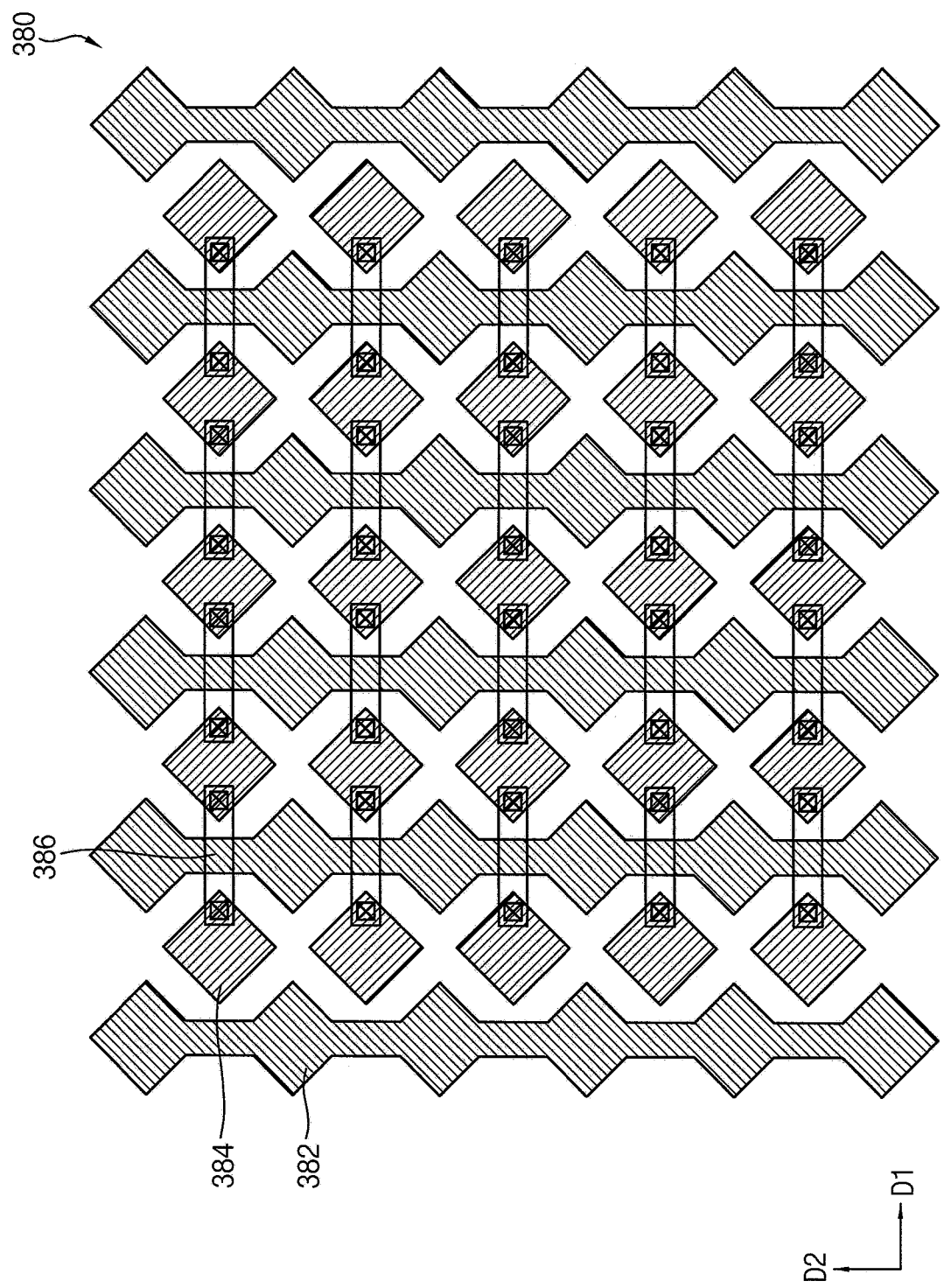
FIG. 24 is a plan view for describing a touch screen structure included in the OLED device in FIG. 23.

FIG. 23 is a sectional view showing an OLED device according to exemplary embodiments of the present invention. FIG. 24 is a plan view for describing a touch screen structure included in the OLED device in FIG. 23. The OLED device 900 illustrated in FIG. 23, except for a touch screen structure 380 and a light shielding structure 880, may have substantially the same or similar configuration as the OLED device 100 described with reference to FIGS. 1 to 6. As for FIG. 23, duplicate descriptions for components substantially the same as or similar to the components described with reference to FIGS. 1 to 6 will be omitted.

Referring to FIGS. 23 and 24, the OLED device 900 may include a substrate 110, an undercut structure 400, a semiconductor element 250, a planarization layer 270, a light emitting structure 200, a pixel defining layer 310, a thin film encapsulation structure 450, a touch screen structure 380, a light shielding structure 880, a functional module 700, and the like. In one or more embodiments, the substrate 110 may include a first organic film layer 111, a first barrier layer 112, a second organic film layer 113 and a second barrier layer 114. In addition, the undercut structure 400 may include a sacrificial metal pattern 405, a first insulating layer pattern 410, a second insulating layer pattern 420, a third insulating layer pattern 430 and a fourth insulating layer pattern 440, and the touch screen structure 380 may include a plurality of first touch screen electrodes 382, a plurality of second touch screen electrodes 384, a plurality of touch screen connecting electrodes 386, a first insulating layer 395, and a second insulating layer 398. Further, the light shielding structure 880 may include a first light shielding pattern 810, a second light shielding pattern 820, a third light shielding pattern 830, a fourth light shielding pattern 840, and a fifth light shielding pattern 850, and the thin film encapsulation structure 450 may include a first thin encapsulation layer 451, a second thin encapsulation layer 452, and a third thin encapsulation layer 453.

The first touch screen electrodes 382 and the second touch screen electrodes 384 may be disposed in the display region 10 on the third thin film encapsulation layer 453. As shown in FIG. 24, each of the first touch screen electrodes 382 may extend in a second direction D2, and be spaced apart from each other in the first direction D1. The second touch screen electrodes 384 may be spaced apart from each other in the second direction D2 between adjacent two first touch screen electrodes 382 among the first touch screen electrodes 382. For example, each of the first and second touch screen electrodes 382 and 384 may include a carbon nano tube (CNT), transparent conductive oxide, indium tin oxide (ITO), indium gallium zinc oxide (IGZO), zinc oxide (ZnO), graphene, silver nanowire (AgNW), copper (Cu), chromium (Cr), and the like.

The first insulating layer 395 may be disposed in the display region 10 on the third thin film encapsulation layer 453, the first touch screen electrodes 382 and the second touch screen electrodes 384. The first insulating layer 395 may cover the first and second touch screen electrodes 382 and 384 in the display region 10, be disposed to have a uniform thickness or substantially a uniform thickness along profiles of the first and second touch screen electrodes 382 and 384, and extend to the peripheral region 30. The first insulating layer 395 may be disposed along a profile of the third thin film encapsulation layer 453 in the peripheral region 30. The first insulating layer 395 may include an organic material or an inorganic material. Alternatively, the first insulating layer 395 may have a multi-layer structure including a plurality of insulating layers. For example, the insulating layers may have different thicknesses or include different materials.

The touch screen connecting electrodes 386 may be disposed in the display region 10 on the first insulating layer 395. As shown in FIG. 24, the touch screen connecting electrodes 386 may electrically connect two second touch screen electrodes 384, which are adjacent to each other in the first direction D1 among the second touch screen electrodes 384, through the contact holes. For example, the touch screen connecting electrodes 386 may include the same material as the first and second touch screen electrodes 382 and 384. Alternatively, the touch screen connecting electrodes 386 may include a metal, an alloy, a metal nitride, a conductive metal oxide, a transparent conductive material, and the like. These may be used alone or in combination with each other.

The second insulating layer 398 may be disposed in the display region 10 and the peripheral region 30 on the first insulating layer 395 and the touch screen connecting electrodes 386. The second insulating layer 398 may cover the touch screen connecting electrodes 386 to have a uniform thickness or substantially a uniform thickness in the display region 10 and the peripheral region 30 on the first insulating layer 395, and may be disposed along profiles of the touch screen connecting electrodes 386. Alternatively, the second insulating layer 398 may be disposed to have a relatively large thickness on the first insulating layer 395. In such an embodiment, the second insulating layer 398 may have a substantially flat upper surface. The second insulating layer 398 may be formed of an organic material or an inorganic material.

The first light shielding pattern 810 may be disposed in the peripheral region 30 on the first barrier layer 112. The first light shielding pattern 810 may be disposed between the undercut structure 400 and the functional module 700. The first light shielding pattern 810 may be formed simultaneously by using the same material in the same layer as the sacrificial metal pattern 405.

The second light shielding pattern 820 may be disposed in the peripheral region 30 on the first insulating interlayer 190. The second light shielding pattern 820 may be disposed between the undercut structure 400 and the functional module 700. The second light shielding pattern 820 may be connected to an upper surface of the first light shielding pattern 810 through a contact hole formed by removing parts of the second organic film layer 113, the second barrier layer 114, the gate insulating layer 150, and the first insulating interlayer 190. The second light shielding pattern 820 may be formed simultaneously by using the same material in the same layer as the source electrode 210 and the drain electrode 230.

The third light shielding pattern 830 may be disposed in the peripheral region 30 on the third thin film encapsulation layer 453. The third light shielding pattern 830 may overlap the second light shielding pattern 820 and the first light shielding pattern 810. The third light shielding pattern 830 may be connected to an upper surface of the second light shielding pattern 820 through a contact hole formed by removing parts of the light emitting layer 330, the upper electrode 340, the first thin film encapsulation layer 451, and the third thin film encapsulation layer 453. The third light shielding pattern 830 may be formed simultaneously by using the same material in the same layer as the first touch screen electrodes 382.

The fourth light shielding pattern 840 may be disposed in the peripheral region 30 on the first insulating layer 395. The fourth light shielding pattern 840 may overlap the third light shielding pattern 830, the second light shielding pattern 820, and the first light shielding pattern 810. The fourth light shielding pattern 840 may be connected to an upper surface of the third light shielding pattern 830 through a contact hole formed by removing a part of the first insulating layer 395. The fourth light shielding pattern 840 may be formed simultaneously by using the same material in the same layer as the touch screen connecting electrodes 386.

The fifth light shielding pattern 850 may be disposed in the peripheral region 30 on the second insulating layer 398. The fifth light shielding pattern 850 may overlap the fourth light shielding pattern 840, the third light shielding pattern 830, the second light shielding pattern 820, and the first light shielding pattern 810. The fifth light shielding pattern 850 may be connected to an upper surface of the fourth light shielding pattern 840 through a contact hole formed by removing a part of the second insulating layer 398. The fifth light shielding pattern 850 may include an organic material such as photoresist, polyacryl-based resin, polyimide-based resin, polyamide-based resin, siloxane-based resin, acryl-based resin, and epoxy-based resin. The fifth light shielding pattern 850 may be substantially opaque. For example, in one or more embodiments, the fifth light shielding pattern 850 may further include a light shielding material to absorb external light. The light shielding material may include carbon black, titanium nitride oxide, titanium black, phenylene black, aniline black, cyanine black, nigrosine acid black, black resin, and the like.

For example, a part of the light emitted from the light emitting structure 200 may be emitted from the display region 10 to the opening region 20 through the organic layer and the inorganic layer disposed on the substrate 110. In other words, a light leakage phenomenon may occur on the surface in which the inorganic layer and the organic layer are in contact with the functional module 700.

The OLED device 900 according to the exemplary embodiments of the present disclosure includes the light shielding structure 880, such that the light emitted through the inorganic layer and the organic layer can be shielded.

Figure 25:
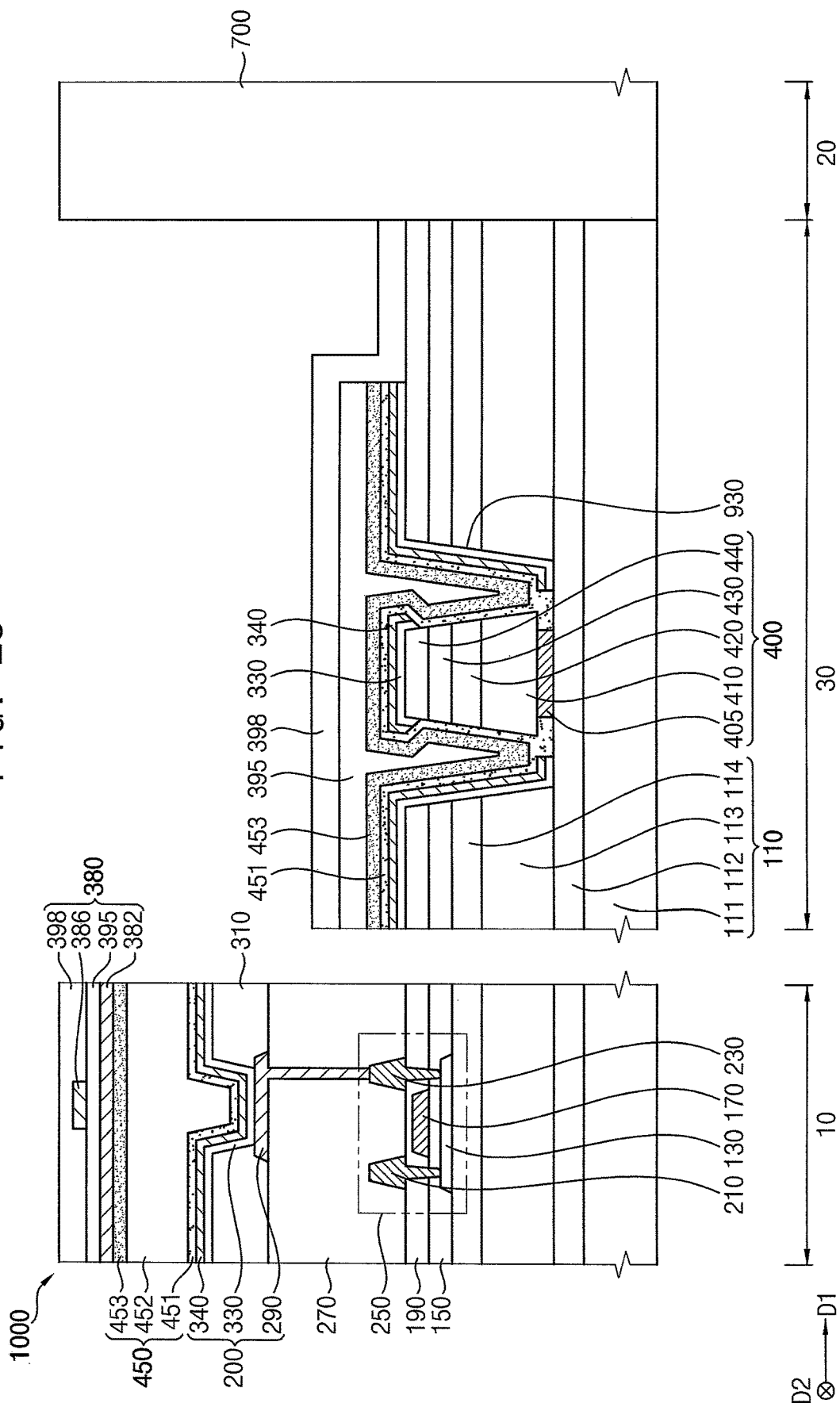
FIG. 25 is a sectional view showing an OLED device according to exemplary embodiments of the present invention.

FIG. 25 is a sectional view showing an OLED device according to exemplary embodiments of the present invention. The OLED device 1000 illustrated in FIG. 25, except for the shapes of the touch screen structure 380, the light emitting layer 330 and the upper electrode 340, may have substantially the same or similar configuration as the OLED device 100 described with reference to FIGS. 1 to 6. As for FIG. 25, duplicate descriptions for components substantially the same as or similar to the components described with reference to FIGS. 1 to 6 will be omitted.

Referring to FIG. 25, the OLED device 1000 may include a substrate 110, an undercut structure 400, a semiconductor element 250, a planarization layer 270, a light emitting structure 200, a pixel defining layer 310, a thin film encapsulation structure 450, a touch screen structure 380, a functional module 700, and the like. In one or more embodiments, the substrate 110 may include a first organic film layer 111, a first barrier layer 112, a second organic film layer 113 and a second barrier layer 114. In addition, the undercut structure 400 may include a sacrificial metal pattern 405, a first insulating layer pattern 410, a second insulating layer pattern 420, a third insulating layer pattern 430 and a fourth insulating layer pattern 440, and the touch screen structure 380 may include a plurality of first touch screen electrodes 382, a plurality of second touch screen electrodes 384, a plurality of touch screen connecting electrodes 386, a first insulating layer 395, and a second insulating layer 398.

Further, the thin film encapsulation structure 450 may include a first thin encapsulation layer 451, a second thin encapsulation layer 452, and a third thin encapsulation layer 453.

The light emitting layer 330 may be disposed on the pixel defining layer 310 and the lower electrode 290 in the display region 10, extend in the first direction D1, and be disposed in the peripheral region 30 on the substrate 110. In exemplary embodiments, the side surface of the light emitting layer 330 might not be in direct contact with the functional module 700 in the peripheral region 30. In other words, the light emitting layer 330 may be spaced apart from the functional module 700 by a predetermined distance in the peripheral region 30.

The upper electrode 340 may overlap the light emitting layer 330 in the display region 10, extend in the first direction D1, and be disposed in the peripheral region 30 on the light emitting layer 330. In exemplary embodiments, the side surface of the upper electrode 340 might not be in direct contact with the functional module 700 in the peripheral region 30. In other words, the upper electrode 340 may be spaced apart from the functional module 700 by a predetermined distance in the peripheral region 30.

The first thin film encapsulation layer 451 may be disposed in the display region 10 and the peripheral region 30 on the upper electrode 340. The first thin film encapsulation layer 451 may cover the upper electrode 340 in the display region 10, be disposed to have a uniform thickness or substantially a uniform thickness along a profile of the upper electrode 340, and extend to the peripheral region 30. The first thin film encapsulation layer 451 may be disposed along the profile of the upper electrode 340 in the peripheral region 30. In exemplary embodiments, the side surface of the first thin film encapsulation layer 451 might not be in direct contact with the functional module 700 in the peripheral region 30. In other words, the first thin film encapsulation layer 451 may be spaced apart from the functional module 700 by a predetermined distance in the peripheral region 30.

The third thin film encapsulation layer 453 may be disposed in the display region 10 on the second thin film encapsulation layer 452 and the peripheral region 30 on the first thin encapsulation layer 451. The third thin film encapsulation layer 451 may cover the second thin film encapsulation layer 451 in the display region 10, be disposed to have a uniform thickness or substantially uniform thickness along a profile of the second thin film encapsulation layer 452, and extend to the peripheral region 30. The third thin film encapsulation layer 453 may be disposed along a profile of the first thin film encapsulation layer 451 in the peripheral region 30. In exemplary embodiments, the side surface of the third thin film encapsulation layer 453 might not be in direct contact with the functional module 700 in the peripheral region 30. In other words, the third thin film encapsulation layer 453 may be spaced apart from the functional module 700 by a predetermined distance in the peripheral region 30.

The first insulating layer 395 may be disposed in the display region 10 on the third thin film encapsulation layer 453, the first touch screen electrodes 382, and the second touch screen electrodes 384. The first insulating layer 395 may cover the first and second touch screen electrodes 382 and 384 in the display region 10, be disposed to have a uniform thickness or substantially uniform thickness along profiles of the first and second touch screen electrodes 382 and 384, and extend to the peripheral region 30. The first insulating layer 395 may be disposed along a profile of the third thin film encapsulation layer 453 in the peripheral region 30. In exemplary embodiments, the side surface of the first insulating layer 395 might not be in direct contact with the functional module 700 in the peripheral region 30. In other words, the first insulating layer 395 may be spaced apart from the functional module 700 by a predetermined distance in the peripheral region 30.

The second insulating layer 398 may be disposed in the display region 10 and the peripheral region 30 on the first insulating layer 395 and the touch screen connecting electrodes 386. The second insulating layer 398 may cover the touch screen connecting electrodes 386 to have a uniform thickness or substantially uniform thickness in the display region 10 and the peripheral region 30 on the first insulating layer 395, and be disposed along profiles of the touch screen connecting electrodes 386. In exemplary embodiments, the second insulating layer 398 may cover a sidewall of the light emitting layer 330, a sidewall of the upper electrode 340, a sidewall of the first thin film encapsulation layer 451, a sidewall of the third thin film encapsulation layer 453, and a side wall of the first insulating layer 395 in the peripheral region 30, and a sidewall of the second insulating layer 398 may be in direct contact with the functional module 700.

For example, the light emitting layer 330 and the upper electrode 340 located in the peripheral region 30 may be short-circuited by the undercut structure 400. In addition, parts of the light emitting layer 330 and the upper electrode 340 located between the undercut structure 400 and the functional module 700 are removed in the process of forming the touch screen structure 380, such that the light emitting layer 330 and the upper electrode 340 can be separated (or short-circuited) from the functional module 700, respectively. In addition, the side surface of the light emitting layer 330 and the side surface of the upper electrode 340 are covered with the second insulating layer 398, such that the moisture and/or humidity can be prevented or at least mitigated from permeating or penetrating into the side surface of the light emitting layer 330 and the side surface of the upper electrode 340. In such an embodiment, the second insulating layer 398 may include an inorganic material.

In the OLED device 1000 according to the exemplary embodiments of the present invention, the light emitting layer 330 and the upper electrode 340 located in the peripheral region 30 are separated from the functional module 700, and the side surface of the light emitting layer 330 and the side surface of the upper electrode 340 are covered by the second insulating layer 398, such that the OLED device 1000 can further prevent or mitigate the moisture and/or humidity from permeating or penetrating into the side surface of the light emitting layer 330 and the side surface of the upper electrode 340.

Figure 26:
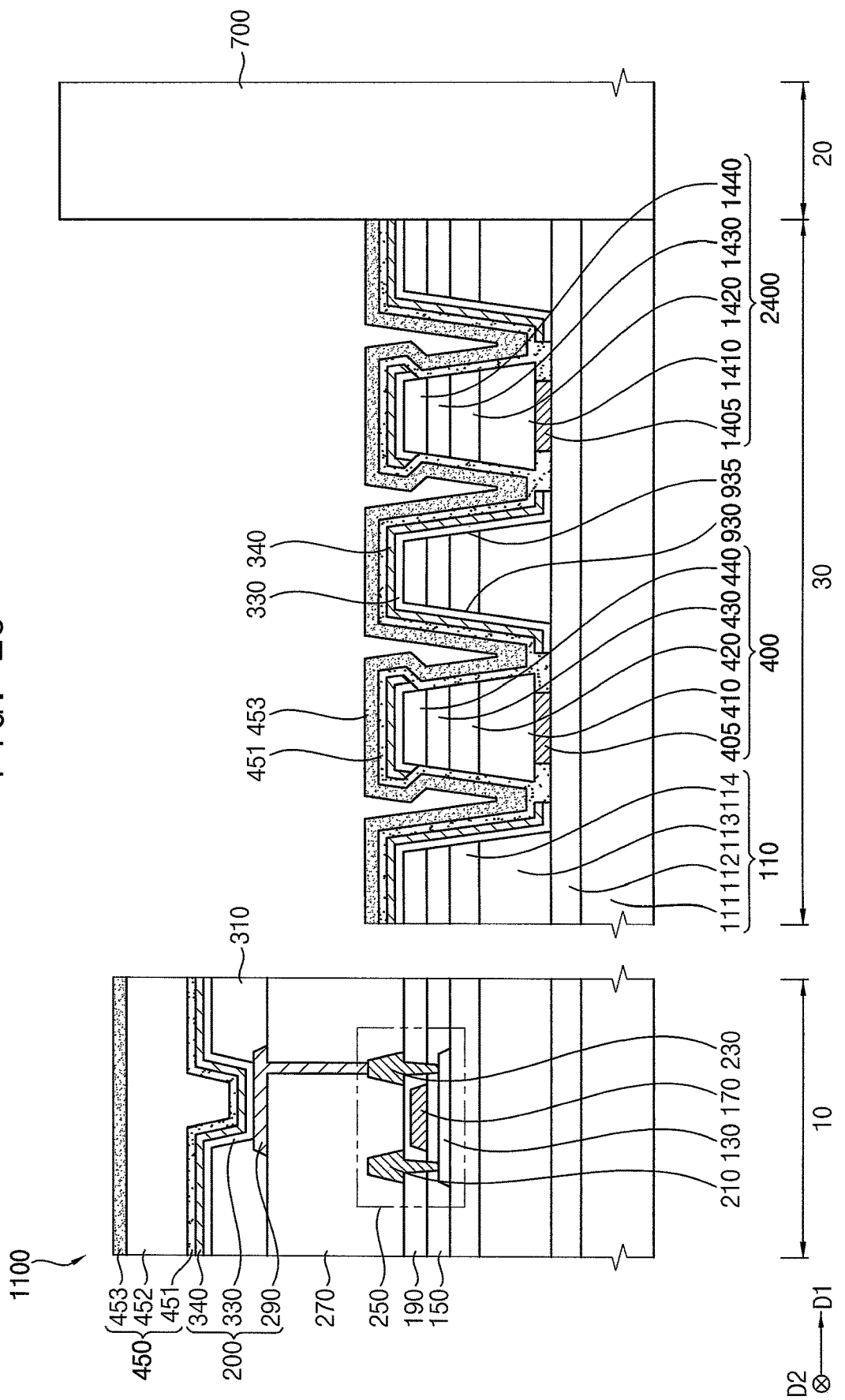
FIG. 26 is a sectional view showing an OLED device according to exemplary embodiments of the present invention.

FIG. 26 is a sectional view showing an OLED device according to exemplary embodiments of the present disclosure. The OLED device 1100 illustrated in FIG. 26, except for a second undercut structure 2400, may have substantially the same or similar configuration as the OLED device 100 described with reference to FIGS. 1 to 6. As for FIG. 26, duplicate descriptions for components substantially the same as or similar to the components described with reference to FIGS. 1 to 6 will be omitted.

Referring to FIG. 25, the OLED device 1100 may include a substrate 110, a first undercut structure 400, a second undercut structure 2400, a semiconductor element 250, a planarization layer 270, a light emitting structure 200, a pixel defining layer 310, a thin film encapsulation structure 450, a functional module 700, and the like. In one or more embodiments, the substrate 110 may include a first organic film layer 111, a first barrier layer 112, a second organic film layer 113 and a second barrier layer 114. In addition, the first undercut structure 400 may include a sacrificial metal pattern 405, a first insulating layer pattern 410, a second insulating layer pattern 420, a third insulating layer pattern 430, and a fourth insulating layer pattern 440, and the second undercut structure 2400 may include a second sacrificial metal pattern 1405, a fifth insulating layer pattern 1410, a sixth insulating layer pattern 1420, a seventh insulating layer pattern 1430, and an eighth insulating layer pattern 1440.

In exemplary embodiments, the substrate 110 may further include a first groove 930 and a second groove 935 formed in the peripheral region 30. The second groove 935 may be located between the first groove 930 and the functional module 700, and the first groove 930 may surround the second groove 935.

The first undercut structure 400 may be disposed inside the first groove 930 and spaced apart from an inner wall of the first groove 930, and the second undercut structure 2400 may be disposed inside the second groove 935 and spaced apart from an inner wall of the second groove 935.

In addition, the light emitting layer 330 and the upper electrode 340 may be spaced apart by the first and second undercut structures 400 and 2400, respectively, inside the first and second grooves 930 and 935. In other words, the light emitting layer 330 and the upper electrode 340 may be short-circuited by the first and second undercut structures 400 and 2400, respectively, inside the first and second grooves 930 and 935. Accordingly, the OLED device 1100 includes the light emitting layer 330 and the upper electrode 340 short-circuited by the first and second undercut structures 400 and 2400 inside the first and second grooves 930 and 935, respectively, such that such that moisture, humidity and the like may be prevented or at least mitigated from permeating or penetrating into the semiconductor element 250 and the light emitting structure 200.

The embodiments of the present disclosure may be applied to various display devices including an OLED device. For example, the embodiments of the present disclosure may be applied to vehicle-display device, a ship-display device, an aircraft-display device, portable communication devices, display devices for display or for information transfer, a medical-display device, etc.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An organic light emitting display device comprising:
    a substrate including an opening region, a peripheral region surrounding the opening region, and a display region surrounding the peripheral region, the substrate comprising a groove in the peripheral region and an opening in the opening region, the groove being formed inside the substrate in a depth direction of the substrate;
    a light emitting structure in the display region on the substrate;
    a semiconductor element between the substrate and the light emitting structure;
    an undercut structure inside the groove in the substrate, the undercut structure comprising:
        a sacrificial metal pattern having a first width; and
        at least one insulating layer pattern having a second width greater than the first width; and
    a functional module in the opening of the substrate,
        wherein the groove extends in the depth direction of the substrate lower than the semiconductor element.

2. The organic light emitting display device of claim 1, wherein the undercut structure is spaced apart from an inner wall of the groove.

3. The organic light emitting display device of claim 1, wherein the groove has a hollow circular shape surrounding the opening of the substrate in a plan view.

4. The organic light emitting display device of claim 1, wherein the undercut structure inside the groove has a hollow circular shape surrounding the opening in a plan view.

5. The organic light emitting display device of claim 1, wherein the substrate comprises:
    a first organic film layer;
    a first barrier layer on the first organic film layer;
    a second organic film layer on the first barrier layer, the second organic film layer comprising a first opening in the peripheral region; and
    a second barrier layer on the second organic film layer, the second barrier layer comprising a second opening overlapping the first opening.

6. The organic light emitting display device of claim 5, wherein the sacrificial metal pattern is on the first barrier layer.

7. The organic light emitting display device of claim 5, wherein the at least one insulating layer pattern comprises:
    a first insulating layer pattern on the sacrificial metal pattern; and
    a second insulating layer pattern on the first insulating layer pattern.

8. The organic light emitting display device of claim 5, wherein the first opening and the second opening define the groove of the substrate.

9. The organic light emitting display device of claim 1, wherein the semiconductor element comprises:
    an active layer in the display region on the substrate;
    a gate insulating layer covering the active layer in the display region on the substrate, the gate insulating layer comprising a third opening exposing the groove in the peripheral region;
    a gate electrode in the display region on the gate insulating layer;
    an insulating interlayer covering the gate electrode in the display region on the gate insulating layer, the insulating interlayer comprising a fourth opening overlapping the third opening in the peripheral region; and
    source and drain electrodes in the display region on the insulating interlayer.

10. The organic light emitting display device of claim 9, wherein the at least one insulating layer pattern comprises:
    a third insulating layer pattern on the sacrificial metal pattern, the third insulating layer pattern being inside the third opening; and
    a fourth insulating layer pattern on the third insulating layer pattern, the fourth insulating layer pattern being inside the fourth opening.

11. The organic light emitting display device of claim 10, wherein the third insulating layer pattern is located at a same layer as the gate insulating layer, and the fourth insulating layer pattern is located at a same layer as the insulating interlayer.

12. The organic light emitting display device of claim 1, wherein the light emitting structure comprises:
   a lower electrode;
   a light emitting layer on the lower electrode; and
   an upper electrode on the light emitting layer.

13. The organic light emitting display device of claim 12, wherein the light emitting layer extends in a direction from the display region to the peripheral region on the substrate, and wherein a portion of the light emitting layer is short-circuited by the undercut structure where the groove is located.

14. The organic light emitting display device of claim 12, wherein the upper electrode extends in a direction from the display region to the peripheral region on the light emitting layer, and wherein a portion of the upper electrode is short-circuited by the undercut structure where the groove is located.

15. The organic light emitting display device of claim 12, wherein the light emitting layer and the upper electrode are at least partially inside the groove.

16. The organic light emitting display device of claim 12, wherein the light emitting layer and the upper electrode are on at least a portion of the undercut structure.

17. The organic light emitting display device of claim 12, wherein the light emitting layer and the upper electrode are not in direct contact with the sacrificial metal pattern.

18. The organic light emitting display device of claim 12, further comprising a thin film encapsulation structure on the light emitting structure,
   wherein the thin film encapsulation structure comprises:
      a first thin film encapsulation layer on the upper electrode, the first thin film encapsulation layer comprising a flexible inorganic material;
      a second thin film encapsulation layer on the first thin film encapsulation layer, the second thin film encapsulation layer comprising a flexible organic material; and
      a third thin film encapsulation layer on the second thin film encapsulation layer, the third thin film encapsulation layer comprising the flexible inorganic material.

19. The organic light emitting display device of claim 18, wherein each of the first and third thin film encapsulation layers extends in a direction from the display region to the peripheral region on the upper electrode, and wherein each of the first and third thin film encapsulation layers is continuous where the groove is located.

20. The organic light emitting display device of claim 18, wherein the sacrificial metal pattern comprises side portions, and wherein both side portions of the sacrificial metal pattern are in direct contact with the first thin film encapsulation layer.

21. The organic light emitting display device of claim 1, wherein the groove in the substrate comprises:
   a first groove in the peripheral region; and
   a second groove between the first groove and the functional module, and
   wherein the first groove surrounds the second groove.

22. The organic light emitting display device of claim 21, wherein the undercut structure comprises:
   a first undercut structure inside the first groove; and
   a second undercut structure inside the second groove.

23. An organic light emitting display device comprising:
   a substrate including an opening region, a peripheral region surrounding the opening region, and a display region surrounding the peripheral region, the substrate comprising a groove in the peripheral region and an opening in the opening region, the groove being formed inside the substrate in a depth direction of the substrate;
   a light emitting structure in the display region on the substrate;
   an undercut structure inside the groove in the substrate, the undercut structure comprising:
      a sacrificial metal pattern having a first width; and
      at least one insulating layer pattern having a second width greater than the first width; and
   a functional module in the opening of the substrate,
   wherein the substrate comprises:
      a first organic film layer;
      a first barrier layer on the first organic film layer;
      a second organic film layer on the first barrier layer, the second organic film layer comprising a first opening in the peripheral region; and
      a second barrier layer on the second organic film layer, the second barrier layer comprising a second opening overlapping the first opening,
   wherein the at least one insulating layer pattern comprises:
      a first insulating layer pattern on the sacrificial metal pattern; and
      a second insulating layer pattern on the first insulating layer pattern,
   wherein the first insulating layer pattern is located at a same layer as the second organic film layer, and the second insulating layer pattern is located at a same layer as the second barrier layer.

24. An organic light emitting display device comprising:
   a substrate including an opening region, a peripheral region surrounding the opening region, and a display region surrounding the peripheral region, the substrate comprising a groove in the peripheral region and an opening in the opening region, the groove being formed inside the substrate in a depth direction of the substrate;
   a light emitting structure in the display region on the substrate;
   a thin film encapsulation structure on the light emitting structure;
   an undercut structure inside the groove in the substrate, the undercut structure comprising:
      a sacrificial metal pattern having a first width; and
      at least one insulating layer pattern having a second width greater than the first width; and
   a functional module in the opening of the substrate,
   wherein the light emitting structure comprises:
      a lower electrode;
      a light emitting layer on the lower electrode; and
      an upper electrode on the light emitting layer,
   wherein the thin film encapsulation structure comprises:
      a first thin film encapsulation layer on the upper electrode, the first thin film encapsulation layer comprising a flexible inorganic material;
      a second thin film encapsulation layer on the first thin film encapsulation layer, the second thin film encapsulation layer comprising a flexible organic material; and
      a third thin film encapsulation layer on the second thin film encapsulation layer, the third thin film encapsulation layer comprising the flexible inorganic material, and wherein the functional module is in contact with a side surface of the substrate, a side surface of the light emitting layer, a side surface of the upper electrode, a side surface of the first thin film encapsulation layer, and a side surface of the third thin film encapsulation layer at a boundary between the peripheral region and the opening region.

\* \* \* \* \*